United States Patent
Damjanovic et al.

(10) Patent No.: US 12,520,599 B2
(45) Date of Patent: Jan. 6, 2026

(54) PHOTOVOLTAIC DEVICES AND METHOD OF MANUFACTURING

(71) Applicant: First Solar, Inc., Tempe, AZ (US)

(72) Inventors: Dan Damjanovic, Boise, ID (US); Markus Gloeckler, Perrysburg, OH (US); Feng Liao, Perrysburg, OH (US); Andrei Los, Perrysburg, OH (US); Dan Mao, Perrysburg, OH (US); Benjamin Milliron, Sylvania, OH (US); Gopal Mor, Perrysburg, OH (US); Rick Powell, Ann Arbor, MI (US); Kenneth Ring, Waterville, OH (US); Aaron Roggelin, Northwood, OH (US); Jigish Trivedi, Pleasanton, CA (US); Zhibo Zhao, Novi, MI (US)

(73) Assignee: First Solar, Inc., Tempe, AZ (US)

( * ) Notice: Subject to any disclaimer, the term of this patent is extended or adjusted under 35 U.S.C. 154(b) by 0 days.

(21) Appl. No.: 18/507,816

(22) Filed: Nov. 13, 2023

(65) Prior Publication Data
US 2024/0088319 A1    Mar. 14, 2024

Related U.S. Application Data

(60) Continuation of application No. 16/664,737, filed on Oct. 25, 2019, now Pat. No. 11,817,516, which is a
(Continued)

(51) Int. Cl.
H10F 10/162    (2025.01)
H10F 71/00    (2025.01)
(Continued)

(52) U.S. Cl.
CPC .......... *H10F 10/162* (2025.01); *H10F 71/10* (2025.01); *H10F 71/125* (2025.01);
(Continued)

(58) Field of Classification Search
CPC .... H10F 10/162; H10F 71/128; H10F 71/125; H10F 77/219; H10F 77/244
See application file for complete search history.

(56) References Cited

U.S. PATENT DOCUMENTS

| | | | |
|---|---|---|---|
| 3,496,024 A | 2/1970 | Ruehrwein | |
| 3,565,686 A | 2/1971 | Babcock et al. | |

(Continued)

FOREIGN PATENT DOCUMENTS

| | | |
|---|---|---|
| AU | 2012200546 | 8/2012 |
| CN | 101079454 | 11/2007 |

(Continued)

OTHER PUBLICATIONS

Burgelman et al. "Modelling polycrystalline semiconductor solar cells", Thin Solid Films, 2000, vol. 361-362, pp. 527-532.
(Continued)

*Primary Examiner* — Tae-Sik Kang
(74) *Attorney, Agent, or Firm* — MacMillan, Sobanski & Todd, LLC

(57) ABSTRACT

A photovoltaic device includes a substrate structure and at least one Se-containing layer, such as a CdSeTe layer. A process for manufacturing the photovoltaic device includes forming the CdSeTe layer over a substrate by at least one of sputtering, evaporation deposition, CVD, chemical bath deposition process, and vapor transport deposition process. The process can also include controlling a thickness range of the Se-containing layer.

20 Claims, 8 Drawing Sheets

Related U.S. Application Data division of application No. 14/602,340, filed on Jan. 22, 2015, now Pat. No. 10,461,207, which is a continuation of application No. 14/531,425, filed on Nov. 3, 2014, now Pat. No. 10,529,883.

(51) Int. Cl.
  *H10F 71/10* (2025.01)
  *H10F 77/123* (2025.01)
  *H10F 77/20* (2025.01)

(52) U.S. Cl.
  CPC ....... *H10F 71/1253* (2025.01); *H10F 71/128* (2025.01); *H10F 71/138* (2025.01); *H10F 77/123* (2025.01); *H10F 77/1237* (2025.01); *H10F 77/219* (2025.01); *H10F 77/244* (2025.01)

(56) References Cited

U.S. PATENT DOCUMENTS

| | | | |
|---|---|---|---|
| 4,296,188 A | 10/1981 | Hodes et al. | |
| 4,368,216 A | 1/1983 | Manassen et al. | |
| 4,382,118 A | 5/1983 | Oka | |
| 4,388,483 A | 6/1983 | Basol et al. | |
| 4,436,558 A | 3/1984 | Russak | |
| 4,568,792 A | 2/1986 | Mooney et al. | |
| 4,614,891 A | 9/1986 | Kuwahata et al. | |
| 4,682,212 A | 7/1987 | Inuiya et al. | |
| 5,279,678 A | 1/1994 | Jordan et al. | |
| 5,578,502 A | 11/1996 | Albright et al. | |
| 5,909,632 A | 6/1999 | Gessert | |
| 6,379,767 B1 | 4/2002 | Park et al. | |
| 6,488,770 B1 | 12/2002 | Meissner et al. | |
| 6,537,845 B1 | 3/2003 | McCandless et al. | |
| 7,518,207 B1 | 4/2009 | Chen et al. | |
| 7,812,249 B2 | 10/2010 | King et al. | |
| 7,985,919 B1 | 7/2011 | Roscheisen et al. | |
| 8,084,682 B2 | 12/2011 | Chen | |
| 8,198,117 B2 | 6/2012 | Leidholm et al. | |
| 8,309,387 B2 | 11/2012 | Forehand | |
| 8,426,722 B2 | 4/2013 | Munteanu et al. | |
| 8,653,616 B2 | 2/2014 | Kamada et al. | |
| 9,276,154 B2 | 3/2016 | Damjanovic et al. | |
| 9,698,285 B2 | 7/2017 | Damjanovic et al. | |
| 10,062,800 B2 | 8/2018 | Blaydes et al. | |
| 10,141,463 B2 | 11/2018 | Korevaar et al. | |
| 10,141,473 B1 | 11/2018 | Blaydes et al. | |
| 10,243,092 B2 | 3/2019 | Damjanovic et al. | |
| 10,461,207 B2 | 10/2019 | Damjanovic et al. | |
| 10,529,883 B2 | 1/2020 | Damjanovic et al. | |
| 10,784,397 B2 | 9/2020 | Blaydes et al. | |
| 11,164,989 B2 | 11/2021 | Andreini et al. | |
| 11,342,471 B2 | 5/2022 | Grover et al. | |
| 11,367,805 B2 | 6/2022 | Los et al. | |
| 11,588,069 B2 | 2/2023 | Andreini et al. | |
| 11,695,085 B2 | 7/2023 | Jayamaha et al. | |
| 11,769,844 B2 | 9/2023 | Damjanovic et al. | |
| 11,784,278 B2 | 10/2023 | Andreini et al. | |
| 11,817,516 B2 | 11/2023 | Damjanovic et al. | |
| 11,843,070 B2 | 12/2023 | Abken et al. | |
| 11,876,140 B2 | 1/2024 | Blaydes et al. | |
| 12,369,426 B2 | 7/2025 | Blaydes et al. | |
| 2003/0070707 A1 | 4/2003 | King et al. | |
| 2004/0063320 A1 | 4/2004 | Hollars | |
| 2004/0261841 A1 | 12/2004 | Negami et al. | |
| 2005/0041571 A1 | 2/2005 | Ichihara et al. | |
| 2006/0213550 A1 | 9/2006 | Yamazaki et al. | |
| 2007/0000537 A1 | 1/2007 | Leidholm et al. | |
| 2007/0295390 A1 | 12/2007 | Sheats et al. | |
| 2008/0110498 A1* | 5/2008 | Zafar | H10F 10/167 204/192.1 |
| 2008/0152868 A1 | 6/2008 | Sato et al. | |
| 2008/0156365 A1 | 7/2008 | Scholz et al. | |
| 2008/0223430 A1* | 9/2008 | Krasnov | C23C 16/407 204/192.1 |
| 2008/0251119 A1 | 10/2008 | Forehand | |
| 2009/0020149 A1 | 1/2009 | Woods et al. | |
| 2009/0025640 A1 | 1/2009 | Sager et al. | |
| 2009/0235986 A1* | 9/2009 | Hotz | H10F 10/162 136/265 |
| 2009/0242029 A1 | 10/2009 | Paulson et al. | |
| 2009/0261438 A1 | 10/2009 | Choi et al. | |
| 2010/0180935 A1 | 7/2010 | Chen | |
| 2010/0186815 A1 | 7/2010 | Yang et al. | |
| 2010/0186816 A1 | 7/2010 | Park et al. | |
| 2010/0206381 A1 | 8/2010 | Aida et al. | |
| 2010/0236607 A1 | 9/2010 | Korevaar et al. | |
| 2010/0243039 A1 | 9/2010 | Korevaar et al. | |
| 2010/0273287 A1 | 10/2010 | Weiner et al. | |
| 2010/0326489 A1 | 12/2010 | Ahn | |
| 2011/0005594 A1 | 1/2011 | Powell et al. | |
| 2011/0011983 A1 | 1/2011 | King et al. | |
| 2011/0024876 A1 | 2/2011 | Bower et al. | |
| 2011/0081743 A1 | 4/2011 | Kawano | |
| 2011/0139227 A1 | 6/2011 | Sivananthan et al. | |
| 2011/0139240 A1 | 6/2011 | Allenic et al. | |
| 2011/0214709 A1 | 9/2011 | Evelsizer et al. | |
| 2011/0220191 A1 | 9/2011 | Flood | |
| 2011/0247687 A1 | 10/2011 | Zhang et al. | |
| 2011/0265865 A1 | 11/2011 | Korevaar | |
| 2011/0272744 A1 | 11/2011 | Ning et al. | |
| 2011/0277838 A1 | 11/2011 | Ma et al. | |
| 2011/0290308 A1 | 12/2011 | Korevaar | |
| 2011/0318941 A1 | 12/2011 | Schmidt et al. | |
| 2012/0017977 A1 | 1/2012 | Satou et al. | |
| 2012/0052617 A1 | 3/2012 | Johnson et al. | |
| 2012/0067392 A1 | 3/2012 | Gloeckler | |
| 2012/0073637 A1 | 3/2012 | Fujdala et al. | |
| 2012/0090661 A1 | 4/2012 | Capps et al. | |
| 2012/0132256 A1 | 5/2012 | Sager | |
| 2012/0132268 A1 | 5/2012 | Rojo et al. | |
| 2012/0138129 A1 | 6/2012 | Kim et al. | |
| 2012/0156828 A1 | 6/2012 | Peng et al. | |
| 2012/0180844 A1 | 7/2012 | Ward, III | |
| 2012/0192923 A1 | 8/2012 | Korevaar et al. | |
| 2012/0192930 A1 | 8/2012 | Fox et al. | |
| 2012/0192948 A1 | 8/2012 | Basol | |
| 2012/0313200 A1 | 12/2012 | Jackrel et al. | |
| 2012/0318352 A1 | 12/2012 | Korevaar | |
| 2013/0000726 A1 | 1/2013 | Skarp | |
| 2013/0037100 A1 | 2/2013 | Bjorkman et al. | |
| 2013/0068279 A1 | 3/2013 | Buller et al. | |
| 2013/0074912 A1* | 3/2013 | Walukiewicz | H10F 10/162 438/94 |
| 2013/0074921 A1 | 3/2013 | Tang et al. | |
| 2013/0081670 A1 | 4/2013 | Ashley et al. | |
| 2013/0104985 A1 | 5/2013 | Korevaar et al. | |
| 2013/0109124 A1 | 5/2013 | Peng et al. | |
| 2013/0280854 A1 | 10/2013 | Jasieniak et al. | |
| 2014/0065763 A1 | 3/2014 | Foust et al. | |
| 2014/0216542 A1 | 8/2014 | Shao et al. | |
| 2014/0216550 A1 | 8/2014 | Damjanovic et al. | |
| 2014/0261667 A1 | 9/2014 | Buller et al. | |
| 2014/0273334 A1 | 9/2014 | Christensen et al. | |
| 2014/0360565 A1 | 12/2014 | Blaydes et al. | |
| 2014/0373908 A1 | 12/2014 | Duggal et al. | |
| 2015/0214403 A1 | 7/2015 | Wu et al. | |
| 2024/0030367 A1 | 1/2024 | Damjanovic et al. | |
| 2024/0055546 A1 | 2/2024 | Andreini et al. | |
| 2024/0154049 A1 | 5/2024 | Blaydes et al. | |

FOREIGN PATENT DOCUMENTS

| | | |
|---|---|---|
| CN | 102244110 | 11/2011 |
| CN | 102365707 | 2/2012 |
| CN | 102365752 | 2/2012 |
| CN | 102484170 | 5/2012 |
| CN | 103222032 | 7/2013 |
| DE | 3415712 | 11/1985 |
| EP | 0248953 | 12/1987 |
| EP | 0300799 | 1/1989 |
| EP | 1378591 | 3/2009 |
| EP | 2381482 | 10/2011 |
| EP | 2482329 | 8/2012 |

(56) References Cited

FOREIGN PATENT DOCUMENTS

| | | |
|---|---|---|
| EP | 2954562 | 12/2015 |
| WO | 2007129097 | 11/2007 |
| WO | 2008136872 | 11/2008 |
| WO | 2010031010 | 3/2010 |
| WO | 2010110467 | 9/2010 |
| WO | 2011036458 | 3/2011 |
| WO | 2012002381 | 1/2012 |
| WO | 2012045113 | 4/2012 |
| WO | 2012094537 | 7/2012 |
| WO | 2014123806 | 8/2014 |
| WO | 2014151610 | 9/2014 |
| WO | 2014179652 | 11/2014 |

OTHER PUBLICATIONS

Chanda, "Copper doped window layer for CdSe colar cells", Graduate School Theses and Dissertations, University of South Florida, 2008, pp. 1-74.
Duenow et al., "CdS/CdTe Solar Cells Containing Directly Deposited CdSxTe1-x Alloy Layers", Presented at the 37th IEEE Photovoltaic Specialists Conference, Seattle, Washington, Jun. 19-24, 2011, pp. 1-8.
Gloeckler et al., "Numerical Modeling of Cigs and CdTe Solar Cells: Setting the Baseline", Photovoltaic Energy Conversion, 2003, Proceedings of the 3rd World Conference, May 11-18, 2003, pp. 1-6.
Gur et al., "Air-Stable All-Inorganic Nanocrystal Solar Cells Processed from Solution", Science, 2005, vol. 310, pp. 462-465.
MacDonald et al., "Layer-by-Layer Assembly of Sintered CdSexTe1-x Nanocrystal Solar Cells", American Chemical Society NANO, 2012, vol. 6, No. 7, pp. 5995-6004.
McCandless et al., "Cadmium Telluride Solar Cells", Handbook of Photovoltaic Science and Engineering, 2003, pp. 617-662.
Murali et al., "Electrical Properties of Sintered CdSxSe1-x Films", Chalcogenide Letters, 2008, vol. 5, No. 9, pp. 181-186.
Noori, "Optical Characteristics of CdSSe Films Prepared by Thermal Evaporation Technique", Baghdad Science Journal, 2011, vol. 8, No. 1, pp. 155-160.
Oladeji et al., "Metal/CdTe/CdS/Cd1-xZnxS/TCO/glass: A new CdTe thin film solar cell structure", Solar Energy Materials & Solar Cells, 2000, vol. 61, pp. 203-211.
Tanaka et al., "Zinc and Selenium Co-doped CdTe Substrates Lattice Matched to HgCdTe", Journal of Crystal Growth, 1989, vol. 94, pp. 166-170.
Toyama et al., "Doping effects of dimethyl-tin-dichloride on material properties of CdS films and on formation of CdS/CdTe heterostructures", Journal of Applied Physics, 2005, vol. 98, pp. 1-6.
Wei et al., "First-Principles Calculation of Band Offsets, Optical Bowings, and Defects in CdS, CdSe, CdTe, and Their Alloys", Journal of Applied Physics, 2000, vol. 87, pp. 1304-1311.
Muthukumarasamy et al., "Fabrication and characterization of n-CdSe 0.7 Te 0.3 /p-CdSe 0.15 Te 0.85 solar cell", Elsevier, Vacuum, 2010, vol. 84, pp. 1216-1219.
Chinese First Office Action, Application No. CN201480037816.X, dated Aug. 4, 2017.
Chinese Second Office Action, Application No. CN201480037816. X, dated Jan. 17, 2018.
Chinese First Office Action, Application No. CN201480045027.0, dated Nov. 4, 2016.
Chinese First Office Action, Application No. CN201580072252.8, dated Jun. 21, 2018.
Chilean Office Action, Application No. CL201503219, dated Oct. 16, 2017.
Chilean Second Office Action, Application No. CL201503219, dated Mar. 14, 2018.
Extended European Search Report, Application No. EP14807775.3, dated Jan. 5, 2017.
Extended European Search Report, Application No. EP14791065.7, dated Nov. 17, 2016.
European Examination Report, Application No. EP14791065.7, dated Jan. 22, 2018.
PCT International Search Report and the Written Opinion, Application No. PCT/US2014/014414, dated Jul. 30, 2014.
PCT International Search Report and the Written Opinion, Application No. PCT/US2014/036501, dated Sep. 5, 2014.
PCT International Search Report and the Written Opinion, Application No. PCT/US2014/036503, dated Sep. 5, 2014.
PCT International Search Report and the Written Opinion, Application No. PCT/US/2015/015387, dated Jun. 23, 2015.
Chinese Final Office Action, Application No. CN201480045027.0, dated Jun. 15, 2017.
Chinese First Office Action, Application No. CN201710890967.5, dated Dec. 5, 2018.
UAE Search and Examination Report, KIPO examination office, Appln. No. UAE/P/1618/2015, dated Nov. 19, 2019.
Chinese 2nd Office Action, Application No. CN201710890967.5 dated Nov. 5, 2019.
Chinese 3rd Office Action, Application No. CN201710890967.5, dated Apr. 10, 2020.
Chinese 2nd Office Action, Application No. CN201580072252.8, dated Apr. 29, 2019.
Extended European Search Report, Application No. EP19190580.1, dated Sep. 12, 2019.
European Examination Report, Application No. EP14791065.7, dated Oct. 16, 2019.
European Examination Report, Application No. EP15706121.9, dated Oct. 21, 2019.
First Examination Report, Indian Application No. 201717014215, dated May 20, 2020.
First Examination Report, Indian Application No. 11893/DELNP/ 2015, dated Aug. 13, 2019.
First Examination Report, Indian Application No. 10489/DELNP/ 2015, dated May 28, 2019.
Intellectual Property India, Hearing Notice, dated Apr. 30, 2021, Indian Patent Application No. 11893/DELNP/2015.
United Arab Emirates Examination and Search Report, dated Nov. 11, 2019, searched by Korean Intellectual Property Office (KIPO), Application No. UAE/P/1483/2015.
European Patent Office Summons to Oral Proceedings, dated May 2, 2022, Application No. EP19190580.1.
Extended European Search, dated Sep. 20, 2022, European Patent Application No. EP22177362.5.
Chinese First Office Action, dated May 26, 2023, Application No. CN202010966136.3.
Chinese Second Office Action, dated Jan. 4, 2024, Application No. CN202010966136.3.
European Communication pursuant to Article 94(3), dated Nov. 7, 2024, Application No. 22 177 362.5.
Chinese Notice of Reexamination, dated Dec. 18, 2024, Application No. 202010966136.3.
Li, "Taiyangneng Dianchi Cailiao Jiqi Yingyong", University of Electronic Science and Technology, China Press, (Jan. 2014), pp. 192-194, with machine translation.
Intellectual Property India, Examination Report, dated Mar. 10, 2025, Application No. 202218026995.

* cited by examiner

PHOTOVOLTAIC DEVICES AND METHOD OF MANUFACTURING

CROSS-REFERENCE TO RELATED APPLICATIONS

This application is a continuation of U.S. application Ser. No. 16/664,737, filed Oct. 25, 2019, now U.S. Pat. No. 11,817,516, granted Nov. 14, 2023, which is a divisional of U.S. application Ser. No. 14/602,340, filed Jan. 22, 2015, now U.S. Pat. No. 10,461,207, granted Oct. 29, 2019, which is a continuation of U.S. application Ser. No. 14/531,425, filed Nov. 3, 2014, now U.S. Pat. No. 10,529,883, granted Jan. 7, 2020, each of which is incorporated by reference in its entirety.

FIELD

Disclosed embodiments relate generally to photovoltaic devices.

BACKGROUND

A photovoltaic structure generates electrical power by converting light into direct current electricity using semiconductor materials that exhibit the photovoltaic effect. The photovoltaic effect generates electrical power upon exposure to light as photons, packets of energy, are absorbed within the semiconductor to excite electrons to a higher energy state, leaving behind an empty state ("hole"). These excited electrons and holes are thus able to conduct and move freely within the material.

A basic unit of photovoltaic structure, commonly called a cell, may generate only small scale electrical power. Thus, multiple cells may be electrically connected to aggregate the total power generated among the multiple cells within a larger integrated device, called a module, or a panel. A photovoltaic module may further comprise a protective back layer and encapsulant materials to protect the included cells from environmental factors. Multiple photovoltaic modules or panels can be assembled together to create a photovoltaic system, or array, capable of generating significant electrical power up to levels comparable to other types of utility-scale power plants. In addition to photovoltaic modules, a utility-scale array would further include mounting structures, electrical equipment including inverters, transformers, and other control systems. Considering various levels of device, from individual cell to utility-scale arrays containing a multitude of modules, all such implementations of the photovoltaic effect may contain one or more photovoltaic structures to accomplish the energy conversion.

To generate power from sunlight, the active area of a photovoltaic structure or device generally includes a bi-layer of two distinct regions, one above the other and each containing one or more materials, where each material may further contain added impurities. The result is that one region in the photovoltaic device is n-type, having an excess of negatively charged electrons, while the other is p-type, having an excess of positively charged holes. These regions are commonly named the window layer, for the n-type region, and the absorber layer, for the p-type region. Where these two regions abut one another, a p-n junction is formed. The window layer is preferred to be as thin as possible in order to allow the maximum amount of light to reach the absorber layer, yet it also needs to be sufficiently thick to maintain a robust p-n junction with the absorber layer.

When photons create free electrons and holes, collectively called charge carriers, near the p-n junction, the internal electric field of the junction causes the electrons to move towards the n side of the junction and the holes towards the p side thereby generating an electrical charge potential. A front contact, electrically connected to the window layer, and a back contact, electrically connected to the absorber layer can provide pathways through which the electrical charge potential can flow to become an electrical current. Electrons can flow back to the p-side via an external current path, or circuit.

While moving within the material generated mobile electrons and holes may recombine due to the presence of recombination centers such as point defects or structural defects, including grain boundaries and material interfaces. This reduces the total number of charge carriers available to generate current flow within the device and the overall conversion efficiency. Efficiency, in this instance, refers to the electrical power or energy generated by the PV device compared to the equivalent energy of photons incident on the device.

The manufacturing of a photovoltaic structure generally includes sequentially forming the functional layers through process that may include vapor transport deposition, atomic layer deposition, chemical bath deposition, sputtering, closed space sublimation, or any other suitable process that creates the desired material. Once a layer is formed it may be desirable to modify the physical characteristics of the layer through subsequent activation processes. For example, an activation step may include passivation, which is defect repair of the crystalline grain structure, and may further include annealing. Imperfections or defects in the crystalline grain disrupt the periodic structure in the layer and can create areas of high resistance or current loss.

An activation process may accomplish passivation of structural or point defects through the introduction of a chemical dopant to the semiconductor bi-layer as a bathing solution, spray, or vapor. Subsequently annealing the layer in the presence of the chemical dopant at an elevated temperature provides grain growth and incorporation of the dopant into the layer. The larger grain size reduces the resistivity of the layer, allowing the charge carriers to flow more efficiently. The incorporation of a chemical dopant may also make the regions of the bi-layer more n-type or more p-type and able to generate higher quantities of mobile charge carriers. Each of these improves efficiency by increasing the maximum voltage the device can produce and reducing unwanted recombination.

In the above activation process, the summary parameters of anneal temperature, chemical bath composition, and soak time, for a particular layer depend on that layer's material and may have adverse effects on other layers present in the photovoltaic structure. For example, during the activation step of the absorber layer, the high temperature anneal may cause the window layer to flux into and intermix with the absorber layer, which can lead to the window layer having a non-uniform thickness or becoming discontinuous, which decreases device performance. It would be desirable to use more chemically potent doping solution, higher annealing temperatures, or longer anneal duration in an activation step to more aggressively treat the absorber layer, as this would increase the benefits conferred on the absorber layer by the activation step. However, using more aggressive process conditions during the activation step can cause more fluxing, thus further degrading or destroying the window layer, which decreases device performance. Alternatively, the TCO may perform the function of the n-type layer. In this case, the constraints of annealing are imposed by film defects at the interface of the TCO and the absorber that may increase recombination.

This problem cannot be solved by simply increasing the initial thickness of the window layer so that if some of the material is fluxed away during the activation step, enough remains to maintain a good junction. This apparent remedy causes other problems as the window layer will absorb some photons and having a thicker window layer after the activation step reduces the available light for photon harvesting at the absorber layer. In general, it may be desired to have a very thin window layer to provide better light transmission to the absorber layer. One method to form very thin windows but allow for aggressive annealing is to interpose an alloy layer to retard the interdiffusion. An example would be to use a CdS/CdS$_x$Te$_{1-x}$/CdTe structure. In this case the ternary alloy layer reduces the concentration gradient in S and thus retards the interdiffusion flux.

Bi-layer semiconductor stacks, such as those having CdSe/CdTe layers, require inter-diffusion to form the desired composition alloy for increased infrared photon absorption. The optimum final Se profile may not be best achieved from the inter-diffusion from a starting bi-layer structure. In this case inter-diffusion from a CdSe/CdSe$_x$Te$_{1-x}$/CdTe tri-layer starting structure can be used to craft a desired final Se profile. For bi-layers and tri-layers, the initial CdSe seed layer is usually not present in the final structure but rather serves as a Se source leading to a graded Se composition within a CdSe$_x$Te$_{1-x}$ layer.

Devices with CdSe$_x$Te$_{1-x}$ as an alloy absorber are typically made by depositing a layer of CdSe or CdSe$_x$Te$_{1-x}$ ternary with a high Se mole fraction x, followed by a layer of CdTe and/or CdSe$_x$Te$_{1-x}$ with a low Se mole fraction. During a subsequent cadmium chloride treatment, the layers are intermixed creating a smooth continuous Se profile in the device. Peak Se concentration in these devices is located at the interface between the device absorber and the TCO.

Therefore, it is desirable to provide an efficient p-n junction between layers of semiconductor materials, incorporating an absorber layer that can be activated with an aggressive activation step.

DESCRIPTION OF THE DRAWINGS

The above, as well as other advantages of the present invention, will become readily apparent to those skilled in the art from the following detailed description of a preferred embodiment when considered in the light of the accompanying drawings in which.

DETAILED DESCRIPTION

The following detailed description and appended drawings describe and illustrate various exemplary embodiments of the invention. The description and drawings serve to enable one skilled in the art to make and use the invention and are not intended to limit the scope of the invention in any manner. In respect of the methods disclosed, the steps presented are exemplary in nature and, thus, the order of the steps is not necessary or critical.

Figure 1:
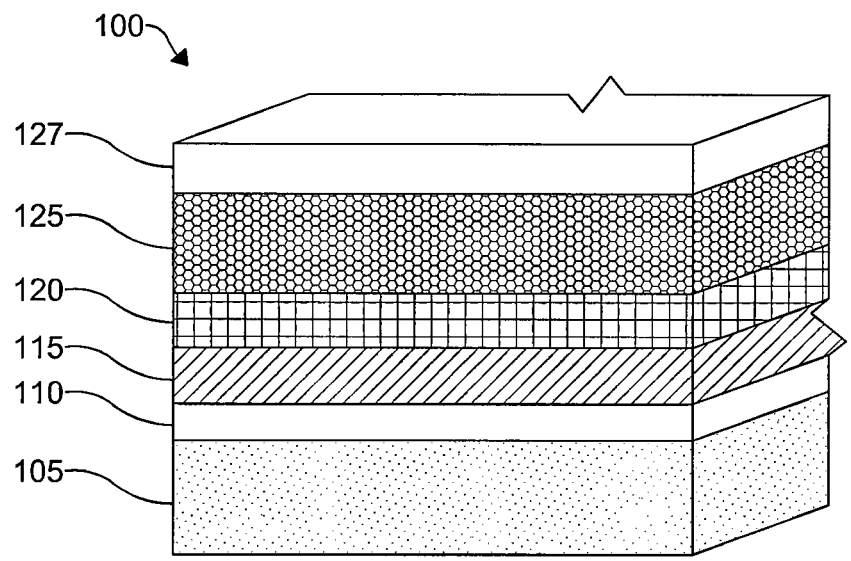
FIG. 1 depicts a schematic of functional layers in a photovoltaic device according to an embodiment of the invention.

Photovoltaic devices generally comprise multiple layers of material. FIG. 1 depicts a photovoltaic device 100 according to the invention wherein a number of layers are shown generally and described herein. The layers that are described herein, the materials used to form the layers, and/or the methods of forming the layers of the photovoltaic device 100 may be substituted, included in addition to layers described, or be absent in the embodiments of the invention described herein below and illustrated in the figures. Several specific embodiments of a novel photovoltaic device will be described with reference to the figures. It is further understood that each of the layers may be deposited in a single layer deposition from a single material, from a multi-layer deposition from a single material, or from a multi-layer deposition from a plurality of materials, as desired.

The photovoltaic device 100 may include a substrate layer 105, a transparent conductive oxide (TCO) layer 110, a window layer 115, an absorber layer 120, a back contact 125, and a back metal electrode 127. The photovoltaic device 100 may further include an interfacial layer, such as a buffer layer, for example, between the various layers of the device. Photovoltaic devices may further include electrical connections, not shown, that provide a current path to communicate generated current flow, such as from one photovoltaic cell to adjacent cells in a module or from one photovoltaic module to adjacent modules in an array. Alternatively, the electrical connections may communicate the current flow to an external load device where the photogenerated current provides power.

Each of the layers described in the following embodiments may be composed of more than one layer or film. Additionally, each layer can cover all or a portion of the device and/or all or a portion of the layer or material underlying the layer. For example, a "layer" can mean any amount of material that contacts all or a portion of a surface. During a process to form one of the layers, the created layer forms on an outer surface, typically a top surface, of a substrate or substrate structure. A substrate structure may include a substrate layer introduced into a deposition process and any other or additional layers that may have been deposited onto the substrate layer in a prior deposition process. Layers may be deposited over the entirety of a substrate with certain portions of the material later removed through laser ablation, scribing, or other material-removal process.

The substrate layer 105 may be formed from glass, for example, soda lime glass or float glass. Alternatively, the substrate layer 105 may be formed from polymeric, ceramic, or other materials that provide a suitable structure for forming a base of photovoltaic cell. The substrate layer 105 may have additional layers applied (not shown) that promote the transmission of photons through its thickness, which may include anti-reflective coatings or anti-soiling coatings. The substrate layer 105 has the TCO layer 110 deposited thereon. The TCO layer 110 may be formed from any suitable transparent conductive oxide, including, but not limited to, indium gallium oxide, cadmium stannate, cadmium tin oxide, silicon oxide, tin oxide, cadmium indium oxide, fluorine doped tin oxide, aluminum doped zinc oxide, indium tin oxide, or various combinations of the foregoing.

The window layer 115 is formed on the TCO layer 110 and may be formed from an n-type semiconductor material such as, for example, CdS, CdSSe, CdSe, zinc sulfide (ZnS), a ZnS/CdS alloy, ZnSO, zinc magnesium oxide, cadmium magnesium sulfide, cadmium tin oxide, indium tin oxide, indium-doped cadmium oxide, aluminum-doped zinc oxide, indium zinc oxide, zinc tin oxide, cadmium oxide, zinc aluminum oxide, zinc silicon oxide, a zinc zirconium oxide, tin aluminum oxide, tin silicon oxide, tin zirconium oxide, or another suitable wide-band gap and stable material. It is understood that a buffer layer (not shown) may be formed between the window layer 115 and the TCO layer 110. It is understood that the photovoltaic device 100 may omit the window layer 115, as desired.

The absorber layer 120 is formed on the window layer 115 (if present) and may be formed from cadmium telluride, cadmium zinc telluride, CdSe, cadmium selenium telluride, Cd(S, Se, Te), CdSTe, copper indium gallium selenide, amorphous silicon, combinations of the foregoing, alloys of the foregoing, or any suitable p-type semiconductor material. The absorber layer 120 may be formed by a layer of material that is deposited on the device 100, or the absorber layer 120 may be formed by a plurality of layers of material deposited on the device 100 that are layer processed (e.g., annealing) to form an alloy which is the absorber layer 120. The absorber layer 120 may also be formed from multiple layers of materials that form a gradient across the absorber layer 120 once the multiple layers are annealed, or the absorber layer 120 may be formed from a single layer of material having a gradient of a material formed thereacross.

The back contact 125 is an interfacial layer between the absorber layer 120 and the back metal electrode 127. The combination of the back contact 125 and the back metal electrode 127 may collectively be referred to generally as the back contact without a distinction being drawn between the layers. The back contact 125 may be formed from any material including tellurium, selenium, gold, tungsten, tantalum, titanium, palladium, nickel, silver, calcium, lead, mercury, graphite, and the like. The back contact 125 may also include ZnTe, a CdTe—ZnTe alloy (e.g., CdZnTe), ZnTe:Cu, indium nitride, HgTe, Te, and PbTe, or any other suitable material. The back metal electrode 127 provides lateral conduction of electricity to the outside circuit. The back metal electrode 127 may be formed from aluminum, copper, nickel, gold, silver, molybdenum nitride, molybdenum, chromium, oxidized metals, nitrides metals, combinations of the foregoing, alloys of the foregoing, or any other metals known to be useful as a conductor in a photovoltaic device. A suitable back contact 125 and electrode 127 is described in the commonly-owned patent application WO2014/151610 for Photovoltaic Device Having Improved Back Electrode and Method of Formation hereby incorporated herein by reference in its entirety, the disclosure of which may be relied upon for enablement with respect to the back contact 125 and electrode 127 portion of the invention.

If an interfacial layer is present in the photovoltaic device 100, the interfacial layer may be formed from any number of materials and may be disposed between any of the various layers of the photovoltaic device, as desired. The interfacial layer may be a buffer layer or a barrier layer that inhibits the diffusion of chemical ions from, into, or across the substrate 105 or another layer of the device 100. For example, one interfacial layer included in the photovoltaic device 100 may be a barrier layer formed between the substrate layer 105 and the TCO layer 110. The barrier layer may be formed from any suitable material, including, but not limited to, silica, alumina, tin oxide, or silicon aluminum oxide. Another example of an interfacial layer may be a buffer layer formed between the TCO layer 110 and the window layer 115 to reduce recombination of holes and electrons at the interface of the TCO layer 110 and the window layer 115. The buffer layer may be formed of any suitable material, including, but not limited to, tin oxide, zinc oxide, zinc tin oxide, zinc doped tin oxide, indium oxide, a mixture of tin and zinc oxides, zinc stannate, zinc magnesium oxide, zinc oxysulfide, cadmium manganese sulfide, or cadmium magnesium sulfide, or combinations of the foregoing, for example.

The photovoltaic device 100 may include other components (not shown) such as, bus bars, external wiring, laser etches, etc. For example, when the device 100 forms a photovoltaic cell of a photovoltaic module, a plurality of photovoltaic cells may be connected in series in order to achieve a desired voltage, such as through an electrical wiring connection. Each end of the series connected cells may be attached to a suitable conductor such as a wire or bus bar, to direct the generated current to convenient locations for connection to a device or other system using the generated current. In some embodiments, a laser may be used to scribe the deposited layers of the photovoltaic device 100 to divide the device into a plurality of series connected cells.

The layers of the photovoltaic device 100 and the devices described herein may be deposited by a sputtering process. In general, sputtering involves the ejectment of atoms from the surface of a target material via energetic bombardment of ions on the surface of the target. Alternatively, the layers may be formed by any other suitable deposition process known in the art, including, but not limited to, pulse laser deposition (PLD), chemical vapor deposition (CVD), electrochemical deposition (ECD), atomic layer deposition (ALD), evaporation, or vapor transport deposition (VTD).

Figure 2:
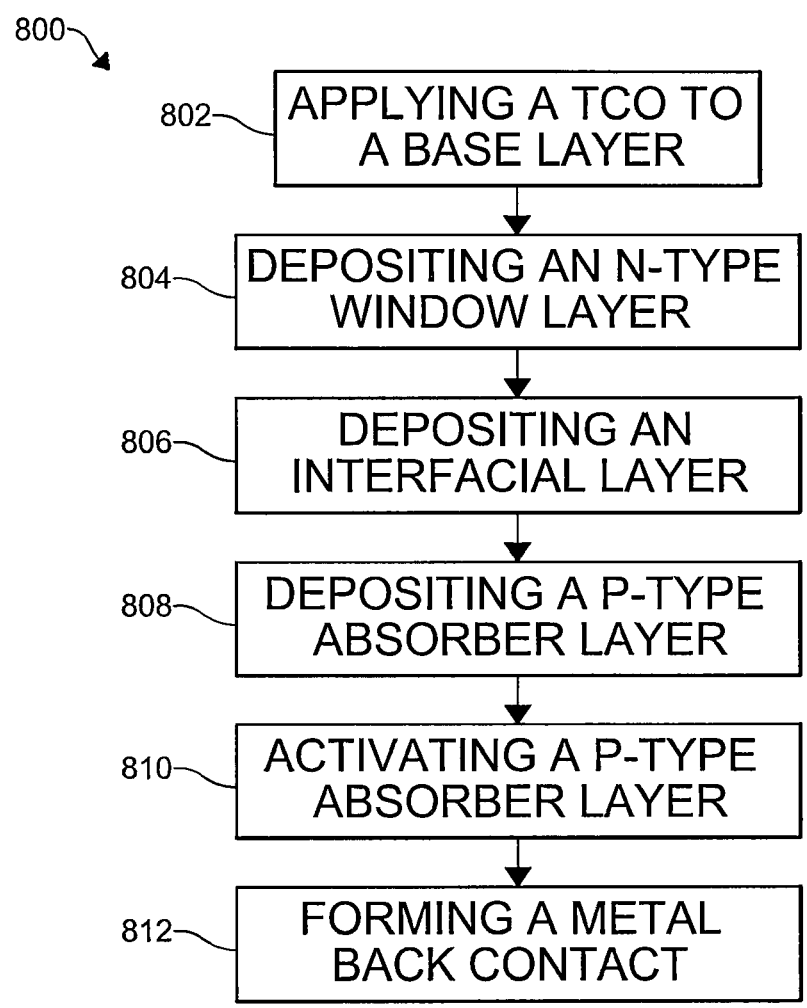
FIG. 2 depicts a process for manufacturing a photovoltaic device according to an embodiment of the invention.

A method of manufacturing a photovoltaic structure, the photovoltaic device 100, for example, is depicted in FIG. 2, can include sequentially forming layers on a substrate. In a first step 802, a TCO layer can be formed on a substrate layer, such as glass. In a second step 804, a window layer can be deposited over the substrate including the previously applied TCO layer and substrate layer. The window layer may include an n-type semiconductor, for example, or the window layer may be omitted. In an optional third step 806, an interfacial layer can be deposited over the substrate including the previously applied n-type window layer, TCO layer, and substrate layer.

In a fourth step 808, an absorber layer can be deposited over the substrate including the optional interfacial layer(s), the n-type window layer, the TCO layer, and the substrate. The absorber layer deposition of the fourth step 808 may include the deposition of one or more precursor layers that require an annealing step or heating step (as described below) after the deposition thereof to form the absorber layer. In embodiments where the absorber layer is formed from one or more precursor layers, a first precursor layer, for example CdSe, is deposited over a substrate structure followed by the deposition of a second precursor layer, for example CdTe, over the first precursor layer. The deposited precursor layers are then annealed (see step 810) to form desired final layer form, for example CdSeTe. The annealing step(s) causes the interdiffusion of Se throughout the CdSeTe layer.

In a fifth step 810, an activation process may be performed on the deposited layers. The activation step 810 can include the introduction of a material containing chlorine to the semiconductor material layers, for example cadmium chloride ($CdCl_2$) as a bathing solution, spray, or vapor, and an associated annealing of the absorber layer at an elevated temperature. For example, if $CdCl_2$ is used, the $CdCl_2$ can be applied over the absorber layer as an aqueous solution. Alternatively, the absorber layer can be annealed with $CdCl_2$ by continuously flowing $CdCl_2$ vapor over the surface of the absorber layer during the annealing step. Alternative chlorine-doping materials can also be used such as $MnCl_2$, $MgCl_2$, $NH_4Cl$, $ZnCl_2$, or $TeCl_4$. A typical anneal can be performed at a temperature of about 350° C.-475° C. for a total duration of 90 minutes or less, with a soaking time equal to or less than about 60 minutes.

A multi-step activation step 810 may be used for each of the embodiments described herein. With each desired activation mechanism in the multi-step activation step 810, such as semiconductor grain growth, chlorine diffusion, sulfur and/or selenium inter-diffusion into the layers, a different thermal activation energy may be required. Using a multi-step process allows each activation mechanism to be optimized. As an example of a multi-step activation process, $CdCl_2$ can be applied in a single step followed by annealing using a multi-step temperature profile. For example, the anneal temperature may be ramped up to 425° C. first, held there for a period of time (e.g. 1-10 minutes) and then ramped up further to 450°-460° C. and held there for an additional period of time (e.g., 1-10 minutes) before ramping the anneal temperature back down. This temperature profile for the above anneal results in different crystallinity characteristics of a CdTe material than those of a device activated in a single anneal step at 425° C. or alternatively at 450°-460° C. As an extension or alternative to this approach, multiple $CdCl_2$ applications, each paired with annealing at varied times and temperatures may also be used to achieve desired layer characteristics. In a sixth step 812, a back contact can be formed over the activated p-type absorber layer.

Figure 3:
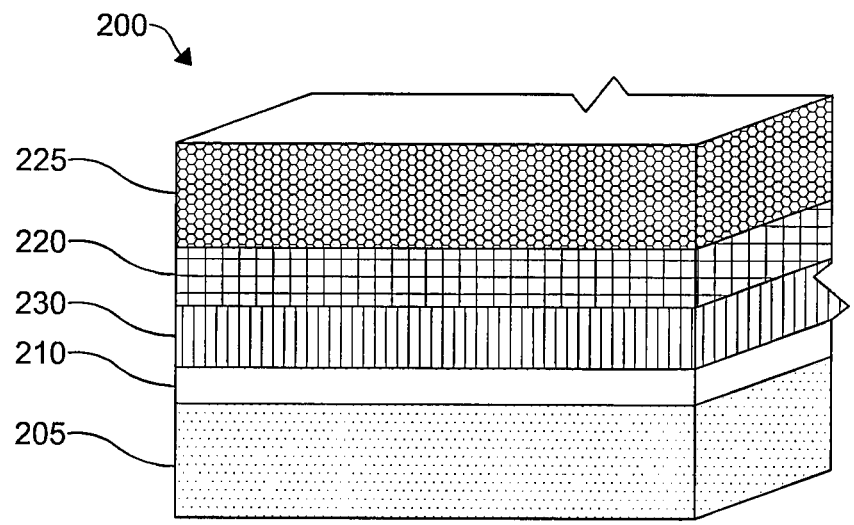
FIG. 3 depicts a schematic of functional layers according to an embodiment of a photovoltaic device.

FIG. 3 illustrates a photovoltaic device 200 according to an embodiment of the invention. The layers of the photovoltaic device 200 are similar to the photovoltaic device 100 except as described below. The photovoltaic device 200 includes an n-type window layer 230 comprising cadmium sulphoselenide (CdSSe) deposited over a substrate layer 205 and a TCO layer 210. A p-type absorber layer 220 is deposited over the CdSSe layer 230. The CdSSe layer 230 and the p-type absorber layer 220 form a p-n junction in the photovoltaic device 200. A back contact 225 is formed over the p-type absorber layer 220. The TCO layer 210 allows light to pass through to a semiconductor window layer 215 while serving as an ohmic electrode to transport photogenerated charge carriers away from the light absorbing material. The back contact 225 serves as a second ohmic electrode to transport photogenerated charge carriers.

The TCO layer 210 may form or may be electrically connected to a front contact. The back contact 225 may form or may be electrically connected to a back contact. The front contact forms a current path through which the electrical current generated by the active layers of the photovoltaic device may flow. The back contact forms a second current path through which generated current may flow. The front contact may connect one photovoltaic cell to an adjacent cell in one direction within a photovoltaic module or, alternatively, to a terminal of the photovoltaic module. Likewise, the back contact may connect the photovoltaic cell to a terminal of the photovoltaic module or, alternatively, to an adjacent cell in a second direction within the photovoltaic module, forming a series configuration. The front contact or back contact may connect the photovoltaic cell to an external terminal of the photovoltaic module in which it is located.

The n-type CdSSe layer 230 forms the window layer, that is, the n-type region of the p-n junction within the photovoltaic device 200. The thickness of the CdSSe layer 230 can be between 10 nm to 100 nm thick or alternatively between 30 nm and 75 nm thick. The CdSSe layer 230 may be composed of cadmium, sulfur and selenium in varying amounts to form a $CdS_{1-x}Se_x$ compound, where x is in the range of about 1 to 25 at %, or alternatively between about 5 to 10 at %. The compositional ratio or atomic percentage (at %) of a compound, for example $CdS_{1-x}Se_x$, is determined by comparing the number of sulfur atoms and the number of selenium atoms in a given amount of the compound with the total sum of sulfur and selenium atoms in the given amount. For example, where x=10 at %, there are 9 sulfur atoms for every 1 selenium atom in a given amount of $CdS_{90\%}Se_{10\%}$ compound.

The CdSSe layer 230 can be manufactured by a deposition process, such as vapor transport deposition, atomic layer deposition, chemical bath deposition, sputtering, closed space sublimation, or any other suitable process. In forming the CdSSe layer 230 using a process requiring the evaporation of powder, such as vapor transport deposition, the CdSSe layer 230 may be formed from the co-evaporation of a blended mixture of CdS and cadmium selenide (CdSe) powder, or the evaporation of a pre-alloyed CdSSe powder. The composition of the blended powders for co-evaporation or the composition of a pre-alloyed powder can be tailored so that the as-deposited film achieves the desired $CdS_{1-x}Se_x$ compositional ratio. Alternatively, a CdSSe layer may be formed by sequentially depositing a CdS layer followed by depositing a CdSe layer with a subsequent annealing or heat treatment process to allow alloying of the two layers to achieve the desired $CdS_{1-x}Se_x$ compositional ratio. The annealing or heat treatment process may be a separate step in a manufacturing process or may occur concurrently with the subsequent deposition of a further layer of the photovoltaic device, for example the deposition of the p-type absorber layer 220.

Although the disclosed embodiments may describe a CdSSe layer as a single layer within the device, in each case the CdSSe layer may comprise multiple layers of CdSSe of varying composition to form a continuous or step-wise gradient of the sulfur to selenium ratio. For example, the CdSSe layer 230 may be formed as a single layer of $CdS_{1-x}Se_x$ where x is held constant throughout the formation process. Alternatively, the CdSSe layer 230 may be formed sequentially as multiple layers of $CdS_{1-x}Se_x$ where x varies in value for each of the sequentially formed layers. For example, a first $CdS_{1-x}Se_x$ layer may be deposited where x=5 at %, and a second $CdS_{1-x}Se_x$ layer may be deposited where x=10 at %. These two adjacent layers may together form the CdSSe layer 230. As a further alternative, the ratio of sulfur to selenium may be varied continuously throughout the formation process so that, for example, the composition of the formed $CdS_{1-x}Se_x$ layer at a first end is x=5 at % and at a second end is x=10 at %, and where x varies continuously from 5 at % to 10% between the first and second ends. The whole of the formed layer having the continuous gradient may form the CdSSe layer 230.

The p-type absorber layer 220 may include a p-type semiconductor material to form the p-type region of the p-n junction within the photovoltaic device 200. The absorber layer 220 preferably absorbs photons passing through from the CdSSe window layer 230 to mobilize charge carriers. The absorber layer 220 may be formed of CdTe, for example. An absorber layer 220 formed of CdTe may further include impurities or dopants in the CdTe bulk material. The absorber layer 220 may be between 200 nm to 8000 nm thick, or alternatively between 1000 nm to 3500 nm thick. The absorber layer 220 may be formed over the CdSSe window layer 230 by a deposition process, such as vapor transport deposition, atomic layer deposition, chemical bath deposition, sputtering, closed space sublimation, or any other suitable process. In the following alternative embodiments, similar layers as those described in the first embodiment are included and similarly numbered (incremented by 100).

In another embodiment of the invention (not shown) similar to that shown in FIG. 3, a CdS layer (not shown) is deposited between the CdSSe layer 230 and the TCO layer 210. During an activation step, the CdSSe layer 230 may diffuse into the CdTe absorber layer, thereby forming a graded $CdS_xTe_ySe_z$ layer at the interface between the CdSSe layer 230 and the absorber layer 220, where $0<x<1$, $0<y<1$, $0<z<1$ at % and $x+y+z=1$.

For example, in an embodiment including a CdSSe layer as either a window layer or as an interfacial layer between a CdS layer and a CdTe absorber layer, during the activation step the CdSSe layer may diffuse into the CdTe absorber layer, thereby forming a graded $CdS_xTe_ySe_z$ layer at the interface between the interfacial layer and the absorber layer, where $0<x<1$, $0<y<1$, $0<z<1$ at % and $x+y+z=1$.

Figure 4:
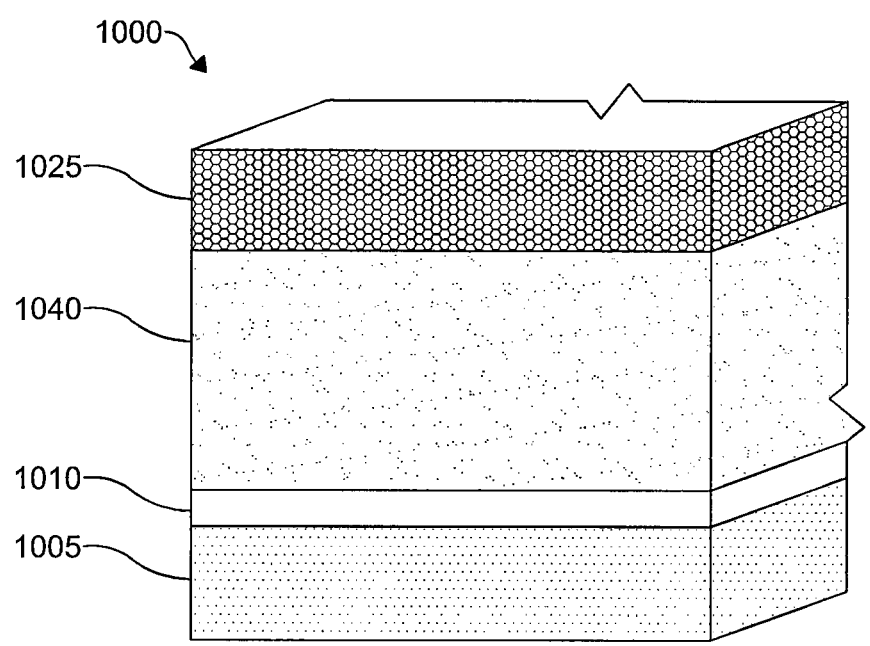
FIG. 4 depicts a schematic of functional layers according to an embodiment of a photovoltaic device.

According to another embodiment of a photovoltaic device 1000, as depicted in FIG. 4, a TCO layer 1010 is formed on a substrate layer 1005. The layers of the photovoltaic device 1000 are similar to those of the photovoltaic device 100 except as described below. A p-type cadmium selenide telluride (CdSeTe) layer 1040 is formed over the TCO layer 1010. The TCO layer 1010 may include a material doped to be n-type in order to form a p-n junction with the p-type CdSeTe layer 1040. A back contact 1025 is formed over the p-type CdSeTe layer 1040. The photovoltaic device 1000 may also include a window layer (not shown) disposed between the TCO layer 1010 and the CdSeTe layer 1040. The window layer may be formed from ZnMgO, ZnSO, CdMgS, or other suitable wide-band gap and stable materials such as those disclosed hereinabove with respect to the photovoltaic device 100.

The CdSeTe layer 1040, as a p-type absorber layer, preferably absorbs the photons passing through from the substrate layer 1005 and TCO layer 1010 to mobilize charge carriers. The thickness of the CdSeTe layer 1040 can be between about 200 nm to 5000 nm thick or alternatively between about 500 nm and 3500 nm thick. The CdSeTe layer 1040 may be composed of cadmium, selenium, and tellurium in varying amounts to form a $CdSe_xTe_{1-x}$ compound, where x is in the range of about 1 to about 40 at %, or alternatively between about 10 to about 25 at %. The compositional ratio (at %) of a compound, for example $CdSe_xTe_{1-x}$, is determined by comparing the number of selenium atoms and the number of tellurium atoms in a given amount of the compound with the total sum of selenium and tellurium atoms in the given amount. For example, where x=10 at %, there are 9 tellurium atoms for every 1 selenium atom in a given amount of $CdSe_{10\%}Te_{90\%}$ compound.

The CdSeTe layer 1040 can be manufactured by a deposition process, such as vapor transport deposition, atomic layer deposition, chemical bath deposition, sputtering, closed space sublimation, or any other suitable process noted hereinabove. In forming the CdSeTe layer 1040 using a process requiring the evaporation of powder, such as vapor transport deposition, the CdSeTe layer 1040 may be formed from the co-evaporation of a blended mixture of CdSe and CdTe powder, or the evaporation of a pre-alloyed CdSeTe powder. The composition of the blended powders for co-evaporation or the composition of a pre-alloyed powder can be tailored so that the as-deposited film achieves the desired $CdSe_xTe_{1-x}$ compositional ratio. Alternatively, a CdSeTe layer may be formed by sequentially depositing a CdSe layer followed by depositing a CdTe layer with a subsequent annealing or heat treatment process to allow alloying of the two layers to achieve the desired $CdSe_xTe_{1-x}$ compositional profile (i.e., a gradient of Se across the CdSeTe layer 1040). The annealing or heat treatment process may be a separate step in a manufacturing process or may occur concurrently with the subsequent deposition or annealing of a further layer of the photovoltaic device, for example the deposition of a back contact 1025 or annealing of CdTe absorber layer.

Figure 12:
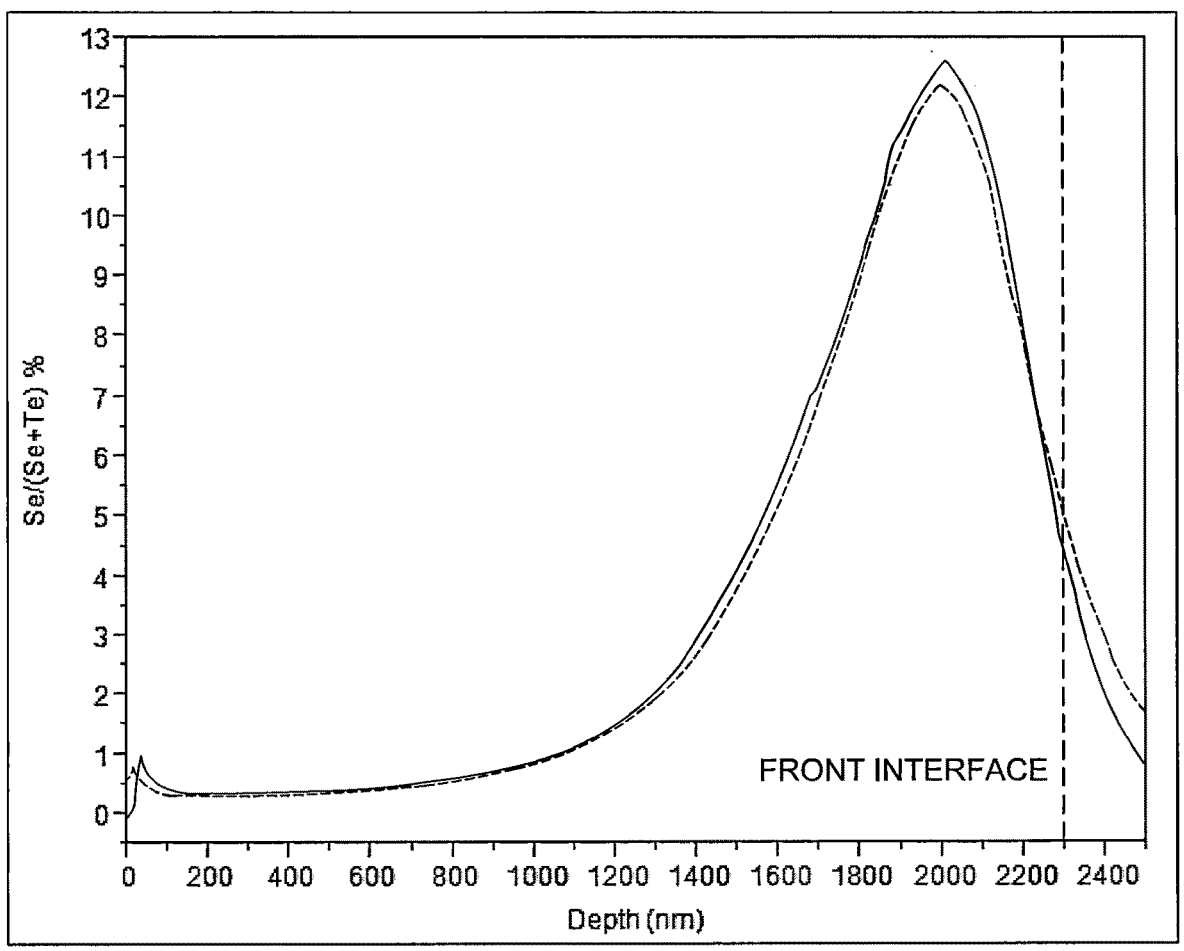
FIG. 12 shows the selenium to tellurium ratio in atomic percentage according to some embodiments of the invention.
Figure 13:
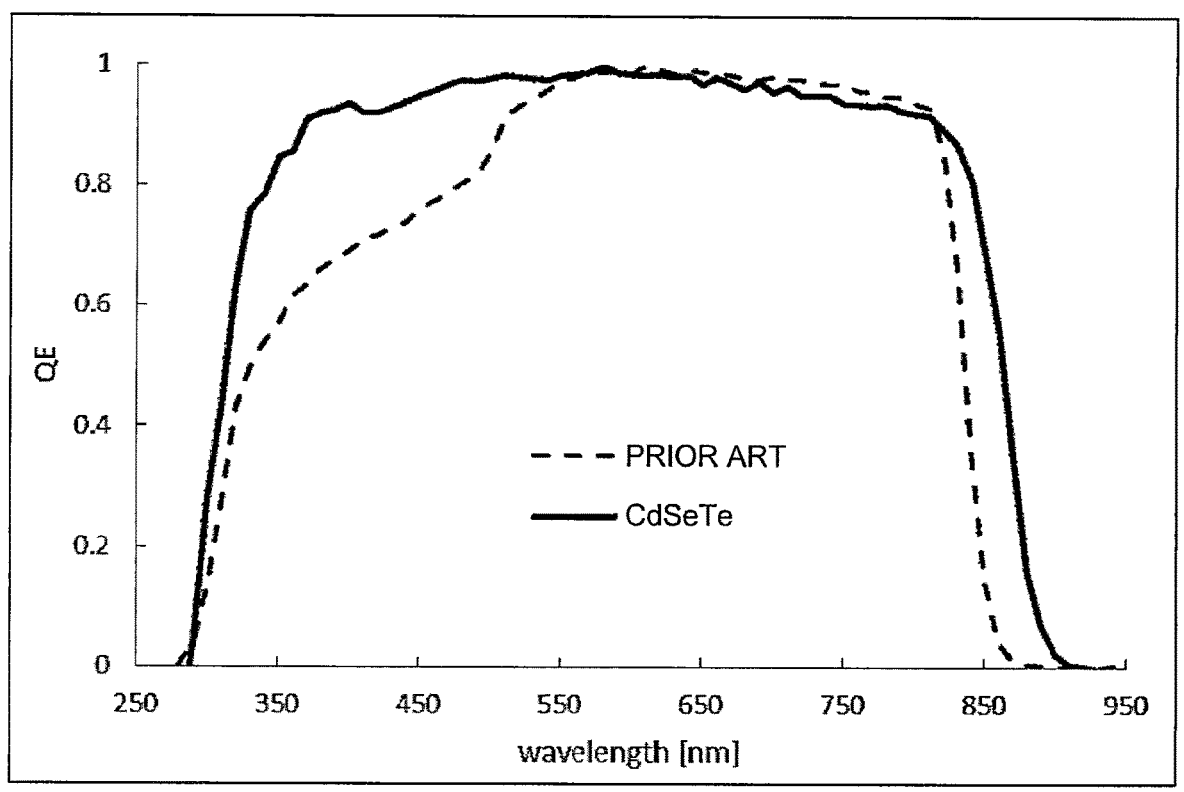
FIG. 13 shows the measured quantum efficiency (QE) for photovoltaic devices according to some embodiments of the invention.

The CdSeTe layer 1040 may also be manufactured by a deposition process resulting in a gradient of Se in the CdSeTe layer 1040. The gradient may result in a concentration of Se adjacent the TCO layer 1010 and a lower concentration of Se adjacent the back contact 1025. It is understood that the concentration of Se adjacent the back contact 1025 may be zero, as desired. The concentration of Se adjacent the TCO layer 1010 may be lower than a concentration of Se adjacent the back contact 1025, as desired. FIG. 12 is an exemplary illustration of the at % of Se in the CdSeTe layer 1040 where the concentration of Se adjacent the TCO layer 1010 is higher than a concentration of Se adjacent the back contact 1025. FIG. 12 illustrates the Se at % versus the depth of the CdSeTe layer 1040. Higher concentration of Se near the TCO layer 1010 relative to the back contact 1025 may allow for a higher fraction of incident radiation to be absorbed in the CdSeTe layer 1040, as shown in FIG. 13. In a device having such a gradient, the band gap of the CdSeTe absorber layer 1040 appears to shift to energies that are lower than the absorber layer of a prior art device (e.g., CdTe absorber, CdSTe absorber, or CdSTe absorbers), as evidenced by a red shifted absorption edge as measured using wavelength dependence of the quantum efficiency (QE) of the solar cells. This is consistent with extensive intermixing of the Te and Se and/or a gradient of Se within the CdSeTe absorber layer 1040 thereby creating a lower band gap alloy. Moreover, Se may improve the passivation of grain boundaries and interfaces, which can be seen through higher bulk lifetime and reduced surface recombination.

The gradient formed within the CdSeTe layer 1040 may be a continuous increase in concentration (see FIG. 12), a step-wise change in concentration, or the like. The gradient formed may be formed by either depositing a material(s) on the having a desired gradient and material profile, or the gradient formed may be formed by depositing discrete layers of material that are subsequently annealed to result in a desired concentration gradient profile. For example, positive results have been obtained in a photovoltaic device 1000 having a desired gradient in the CdSeTe layer 1040 with a concentration of Se higher adjacent a TCO layer 1010 and a lower concentration of Se adjacent the back contact 1025 by annealing a stack of layers including CdSe (adjacent the TCO layer 1010)/CdSeTe/CdSe/CdTe (adjacent the back contact 1025). Positive results have also been obtained in a photovoltaic device 1000 having a desired gradient in the CdSeTe layer 1040 by annealing a stack including CdSe/CdTe. Furthermore, positive results have been obtained in a photovoltaic device 1000 having a desired gradient in the CdSeTe layer 1040 by annealing and a stack including the following stack of layers CdSe/CdSeTe/CdTe.

Figure 5:
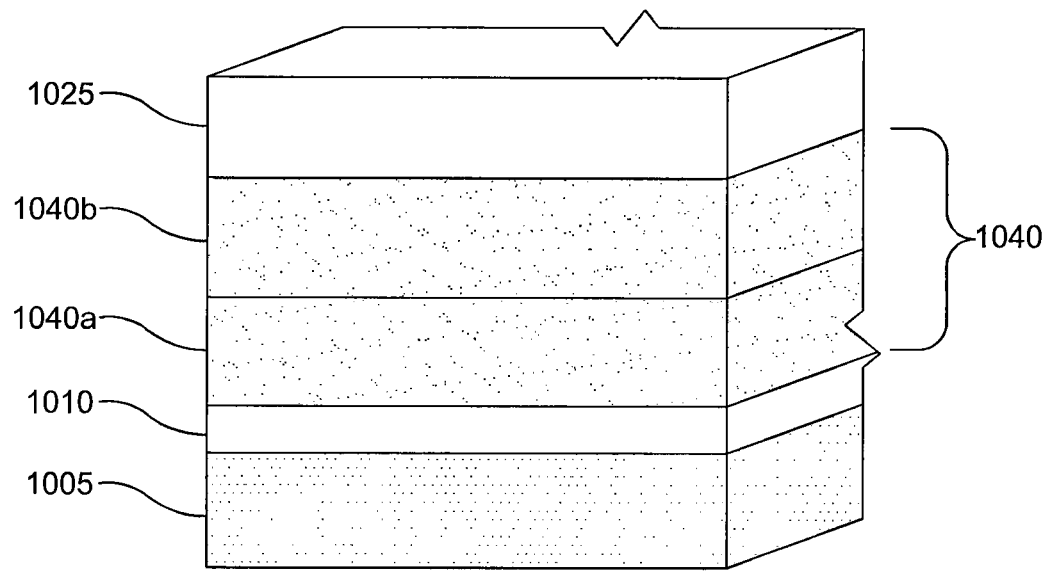
FIG. 5 depicts a schematic of functional layers of the photovoltaic device of FIG. 3 according to another embodiment.

In some embodiments, as shown in FIG. 5, the concentration of Se in the layer 1040 may vary between a plurality of regions, such as a first region 1040a and a second region 1040b, and the regions may continuously change across the thickness of the respective regions. In some instances, the rate of change in concentration in the regions may itself vary through one or more of the regions, for example, increasing in some portions and decreasing in yet other portions. Similarly, in some embodiments, the first region 1040a may have a band gap that is lower than a band gap of the second region 1040b. In such instances, the concentration of selenium in the first region 1040a relative to the second region 1040b may be in a range such that the band gap of the first region 1040a is lower than the band gap of the second region 1040b.

Although the disclosed embodiments shown in FIGS. 4 and 5 may describe a CdSeTe layer as a single layer of the absorber layer 1040 within the device, in each case the CdSeTe layer may comprise multiple layers of Cd, Se, CdSe, Cd(S, Se, Te) and/or CdSeTe of varying composition to form the gradient (continuous or step-wise) of the selenium to tellurium ratio. For example, the CdSeTe layer 1040 may be formed as a single layer of $CdSe_xTe_{1-x}$ where x is held constant throughout the formation process. Alternatively, the CdSeTe layer 1040 may be formed sequentially as multiple layers of $CdSe_xTe_{1-x}$ where x varies in value for each of the sequentially formed layers. For example, a first $CdSe_xTe_{1-x}$ layer may be deposited where x=10 at %, and a second $CdSe_xTe_{1-x}$ layer may be deposited where x=5 at %. These two adjacent layers may together form the CdSeTe layer 1040. As a further alternative, the ratio of selenium to tellurium may be varied continuously throughout the formation process so that, for example, the composition of the formed $CdSe_xTe_{1-x}$ layer at a first end is x=10 at % and at a second end is x=5 at %, and where x varies continuously from 10 at % to 5% between the first and second ends. The whole of the formed layer having the continuous gradient may form the CdSeTe layer 1040. Alternatively, a graded CdSeTe layer 1040 may be formed from a multi-layered deposition process where each of the multi-layers includes Se (e.g., Se, CdSe, CdSeTe, Cd(S, Se, Te), and the like) and each of the layers has a different concentration of Se. For example, a first layer of material to form the CdSeTe layer 1040 adjacent the TCO layer 1010 may have a thickness less than a thickness of subsequent layers but with a higher concentration of Se therein. Another example includes a multi-layer deposition of materials that includes S in a first layer of material deposited adjacent the TCO layer 1010. When the multi-layers are annealed to form the CdSeTe layer 1040, the material of the first layer and the S present therein may be substantially present only adjacent the TCO layer 1010 or the S may be allowed to disperse throughout the layer 1040. In yet another example, the multi-layer deposition of materials to form the CdSeTe layer 1040 has a concentration of Se that declines across the thickness thereof, and that includes S adjacent the TCO layer 1010.

In processes including a multi-layer deposition, the CdSeTe layer 1040 includes a plurality of grains separated by grain boundaries. In some embodiments, an atomic concentration of selenium in the grain boundaries is higher than the atomic concentration of selenium in the grains. In some embodiments, a ratio of the average atomic concentration of selenium in the grain boundaries to the average atomic concentration of selenium in the grains is greater than about 2. In some embodiments, a ratio of the average atomic concentration of selenium in the grain boundaries to the average atomic concentration of selenium in the grains is greater than about 5. In some embodiments, a ratio of the average atomic concentration of selenium in the grain boundaries to the average atomic concentration of selenium in the grains is greater than about 10.

Figure 6:
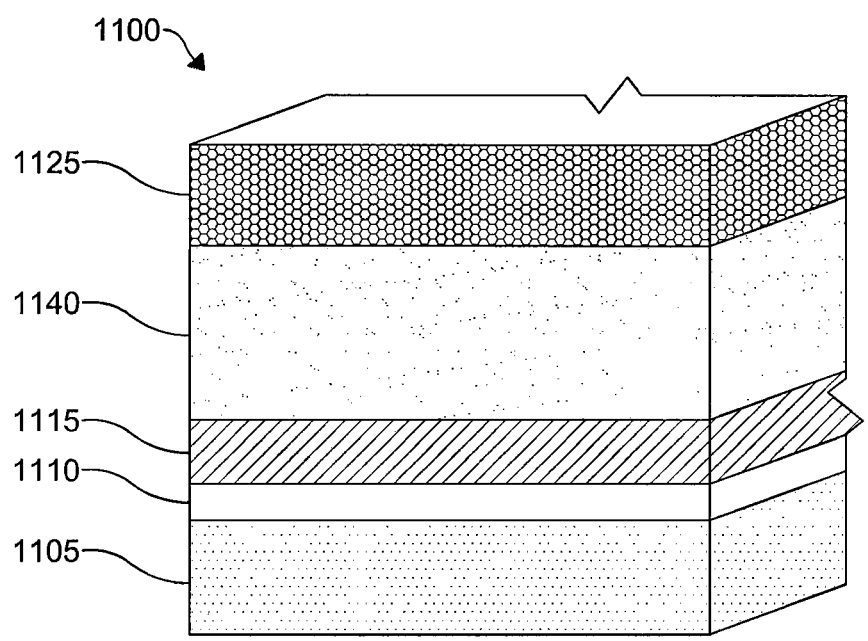
FIG. 6 depicts a schematic of functional layers according to an embodiment of a photovoltaic device.

According to another embodiment of a photovoltaic device 1100, as depicted in FIG. 6, a window layer 1115 is formed over a TCO layer 1110 over the substrate layer 1105. The layers of the photovoltaic device 1100 are similar to those of the photovoltaic device 1000 except as described hereinbelow. A p-type CdSeTe layer 1140 is formed over the window layer 1115. The window layer 1115 forms a p-n junction with the p-type CdSeTe layer 1140. A back contact 1125 is formed over the p-type CdSeTe layer 1140.

Figure 7:
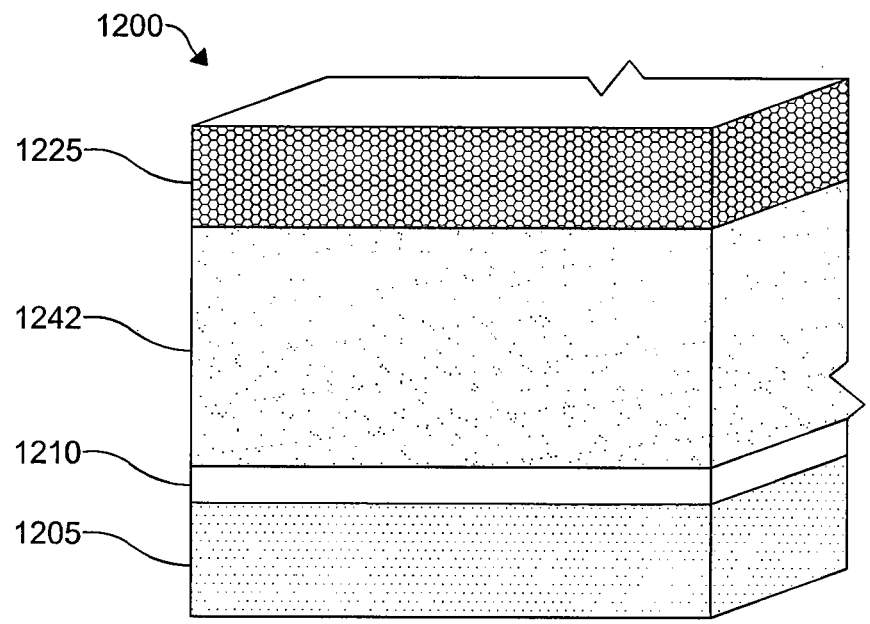
FIG. 7 depicts a schematic of functional layers according to an embodiment of a photovoltaic device.

According to an embodiment of the invention depicted in FIG. 7, a photovoltaic device 1200 includes a TCO layer 1210 formed over a substrate layer 1205. The layers of the photovoltaic device 1200 are similar to those of the photovoltaic device 100 except as described below. A cadmium sulfur selenide telluride (Cd(S,Se,Te)) layer 1242 is formed over the TCO layer 1210. A back contact 1225 is formed over the p-type Cd(S,Se,Te) layer 1242. The Cd(S,Se,Te) layer 1242 is formed from a compound of cadmium, sulfur, selenium, and tellurium, $CdS_ySe_xTe_{1-(x+y)}$ where 0<x<1, and 0<y<1, and 0<(x+y)<1, or alternatively where 0.02<x<0.25 and 0.02<y<0.25, or as a further alternative, where 0.05<x<0.20 and 0.02<y<0.05. The Cd(S,Se,Te) layer 1242 is between about 200 nm to about 5000 nm thick, or alternatively between about 500 nm to about 3500 nm thick.

In one embodiment, the Cd(S,Se,Te) layer 1242 comprises multiple sub-layers where x and y vary to provide preferred concentrations a various points through the layer thickness. For example, in one embodiment both x and y may vary to provide a higher sulfur and selenium concentration adjacent the TCO layer 1210, and decrease throughout the thickness of the layer moving away from the TCO layer 1210. In other alternative embodiments, the value of x or y or both may remain constant throughout the Cd(S,Se,Te) layer 1242 between the TCO layer 1210 and back contact 1225.

The Cd(S,Se,Te) layer 1242 can be manufactured by a deposition process, such as vapor transport deposition, atomic layer deposition, chemical bath deposition, sputtering, closed space sublimation, or any other suitable process. However, in forming the Cd(S,Se,Te) layer 1242 using a process requiring the evaporation of powder, such as vapor transport deposition, the Cd(S,Se,Te) layer 1242 may be formed from the co-evaporation of a blended mixture of CdS, CdSe, and CdTe powders, or the evaporation of a pre-alloyed Cd(S,Se,Te) powder. The composition of the blended powders for co-evaporation or the composition of a pre-alloyed powder can be tailored so that the as-deposited film achieves the desired $CdS_ySe_xTe_{1-(x+y)}$ compositional ratio. Alternatively, a Cd(S,Se,Te) layer may be formed by sequentially depositing a CdS layer followed by depositing a CdSeTe layer, or various other combinations of compounds containing cadmium, sulfur, selenium and tellurium, with a subsequent annealing or heat treatment process to allow alloying of the two layers to achieve the desired $CdS_ySe_xTe_{1-(x+y)}$ compositional ratio. The annealing or heat treatment process may be a separate step in a manufacturing process or may occur concurrently with the subsequent deposition of a further layer of the photovoltaic device, for example the deposition of the back contact 1225.

Figure 8:
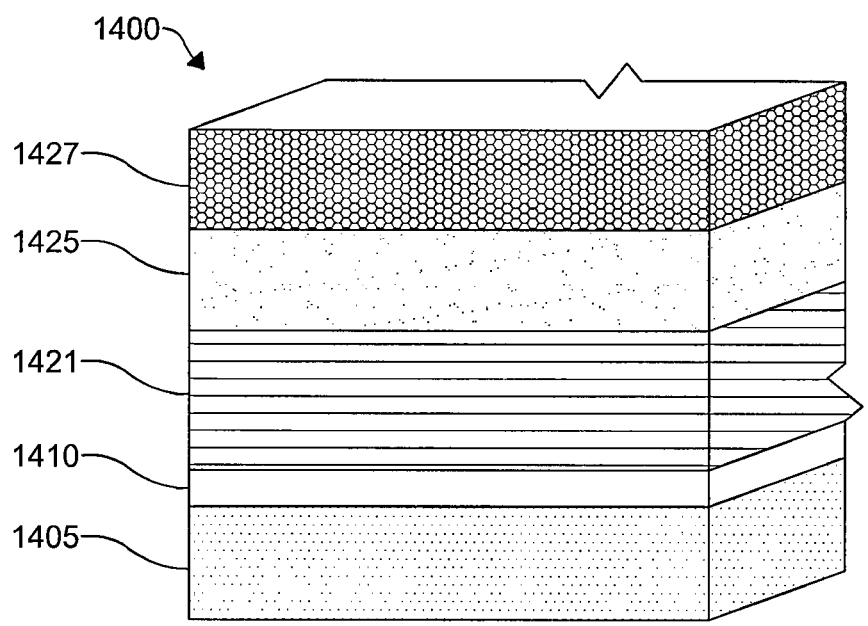
FIG. 8 depicts a schematic of functional according to an embodiment of a photovoltaic device.

According to another embodiment of the invention shown in FIG. 8, a photovoltaic device 1400 includes a TCO layer 1410 formed over a substrate layer 1405. An absorber layer 1421 is formed adjacent the TCO layer 1410. The absorber layer 1421 may be formed via the annealing of a CdTe layer 1420 and a CdSe layer 1411, as described herein. A back contact 1425 is formed over the CdTe layer 1420, and a back metal electrode 1427 is formed over the back contact 1425. The TCO layer 1410 may have any thickness desired, such as between about 300 Å and about 4500 Å, or more specifically between about 300 Å and about 800 Å, or more specifically between about 3500 Å and about 4500 Å. In this embodiment, the TCO layer 1410 is formed from a plurality of layers of material comprising $SnO_2$ and $SnO_2$:F. If more than one layer of each $SnO_2$ and $SnO_2$:F is present, that materials may be alternating. The CdSe layer 1411 formed on the $SnO_2$ layer has a thickness of about 900-1500 Å. The CdTe layer 1420 has a thickness of about 1.7-2.5 microns. The CdTe layer 1420 may be formed from the deposition of a single layer of material, or the CdTe layer 1420 may be formed from the deposition of two or more layers of CdTe, Cd, and/or Te. The combination of the CdSe layer 1411 and the CdTe layer 1420 layer may have a thickness of about 0.5-3.5 microns, as desired. The back contact 1425 is formed from ZnTe. Alternatively, the back contact 1425 may be formed from a layer of ZnTe and a layer of CdZnTe alloy. The back contact 1425 may also include a layer of Cu disposed thereon with a concentration of about 0.01-1% Cu by atomic weight. The back metal electrode 1427 is formed from a layer of $MoN_x$ adjacent the back contact 1425, a layer of chromium, and a layer of aluminum disposed therebetween. The chromium layer may have a thickness from about 0-200 Å, such as about 200 Å, the aluminum layer may have a thickness 700-1000 Å, such as about 750 Å, and the $MoN_x$ layer may have a thickness from about 50-170 Å, such as about 170 Å.

Figure 8A:
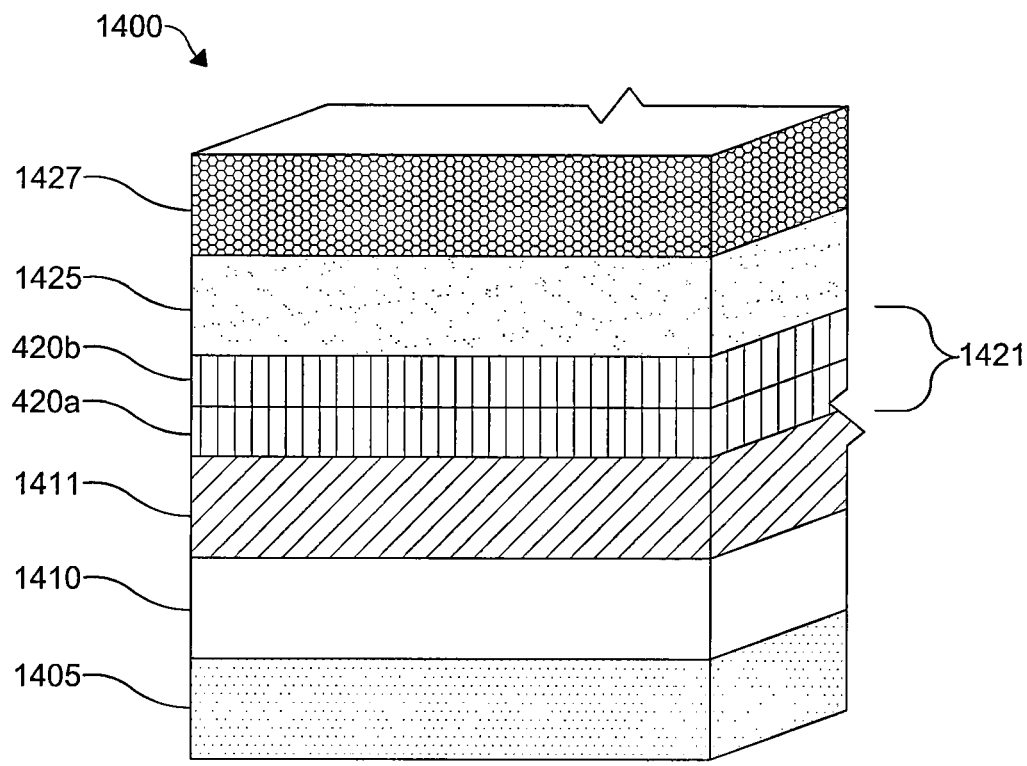
FIG. 8a depicts a schematic of functional layers in the photovoltaic device of FIG. 7 prior to an annealing step.

A method of manufacturing the photovoltaic structure 1400 includes steps similar to those described above and shown in FIG. 2 except that the CdSe layer 1411 is deposited on the TCO layer 1410. The CdSe layer 1411 may be deposited using a sputtering deposition process. A first layer of CdTe 1420a (a precursor layer) is then deposited on the CdSe layer 1411. A second layer of CdTe 1420b (another precursor layer) is then deposited on the first layer of CdTe 1420a. Once the second layer of CdTe 1420b has been applied, the CdTe layer 1420 is formed, as shown in FIG. 8a. The CdSe 1411 and the CdTe layer 1420 are then annealed to form an alloy thereof, CdSeTe, as the absorber layer 1421 as shown in FIG. 8. The underlying layers, once annealed may result in an absorber layer 1421 having a thickness of about 0.5-3.5 microns, of about 1-3 microns, a thickness of about 1 micron, a thickness of about 3.0 microns, as desired. The annealing process may consume substantially all of the CdSe layer 1411, or a portion of the CdSe layer 1411 may remain between the TCO layer 1410 and the CdSeTe absorber layer 1421. Similarly, the annealing process may consume substantially all of the CdTe layer 1420, or a portion of the CdTe layer 1420 may remain between the CdSeTe absorber layer 1421 and the back contact 1425.

Figure 8B:
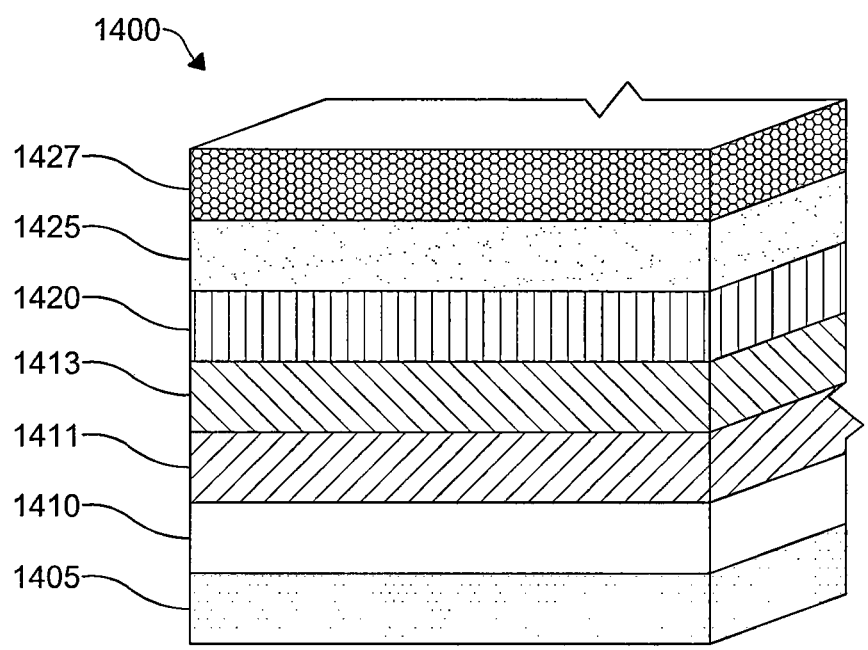
FIG. 8b depicts a schematic of functional layers in the photovoltaic device of FIG. 7 prior to an annealing step according to another embodiment of the invention.

The embodiment shown in FIG. 8b is similar to the embodiment described with respect to FIG. 8a with methods of forming each substantially the same except that a CdSeTe layer 1413 is deposited on the CdSe layer 1411 prior to deposition of the CdTe layer 1420 in either a single layer deposition of CdTe or in multiple layers of CdTe. The CdSe layer 1411, the CdSeTe layer 1413, and the CdTe layer 1420 are then annealed to form the absorber layer 1421 as shown in FIG. 8. The annealing process may consume substantially all of the CdSe layer 1411 or a portion of the CdSe layer 1411 may remain adjacent the TCO layer 1410. Similarly, the annealing process may consume substantially all of the CdTe layer 1420 or a portion of the CdTe layer 1420 may remain between the CdSeTe absorber layer 1421 and the back contact 1425.

Once the absorber layer 1421 is formed (either from the structure described above and shown in FIG. 8a or from the structure described above and shown in FIG. 8b), the absorber layer 1421 is then cleaned to remove impurities, debris, oxides, and the like that have formed thereon. The absorber layer 1421 may be cleaned with oxalic acid, hydrochloric acid, or any acid or other suitable cleaning material. The absorber layer 1421 may be then be doped with Cu. For example, if hydrochloric acid is used to clean the absorber layer 1421, the absorber layer 1421 may be subsequently doped with Cu in a concentration of about 0.5-1.0 ppm. The hydrochloric acid cleaning step may be combined with the Cu doping step, as desired.

The back contact 1425 is then deposited on the cleaned absorber layer 1421. The back contact 1425 may be formed via the deposition of a single ZnTe layer or from the deposition of a ZnTe layer adjacent the absorber layer 1421 and a CdZnTe layer adjacent the ZnTe layer. The CdZnTe layer may be formed by depositing a layer of CdTe on the ZnTe layer and then annealing the same to form the alloy therebetween. The back contact 1425 may also include a layer of Cu disposed thereon with a concentration of 0.01-1% Cu by atomic weight. The layer of Cu may be disposed between the absorber layer 1421 and the back contact 1425, between the layers of the back contact 1425, or between the back contact 1425 and the back metal electrode 1427, as desired. The back metal electrode 1427 is then deposited on the back contact 1425. The back metal electrode 1427 is formed from a layer $MoN_x$ formed adjacent the back contact 1425, then a layer of aluminum, and then a layer of chromium.

Figure 9:
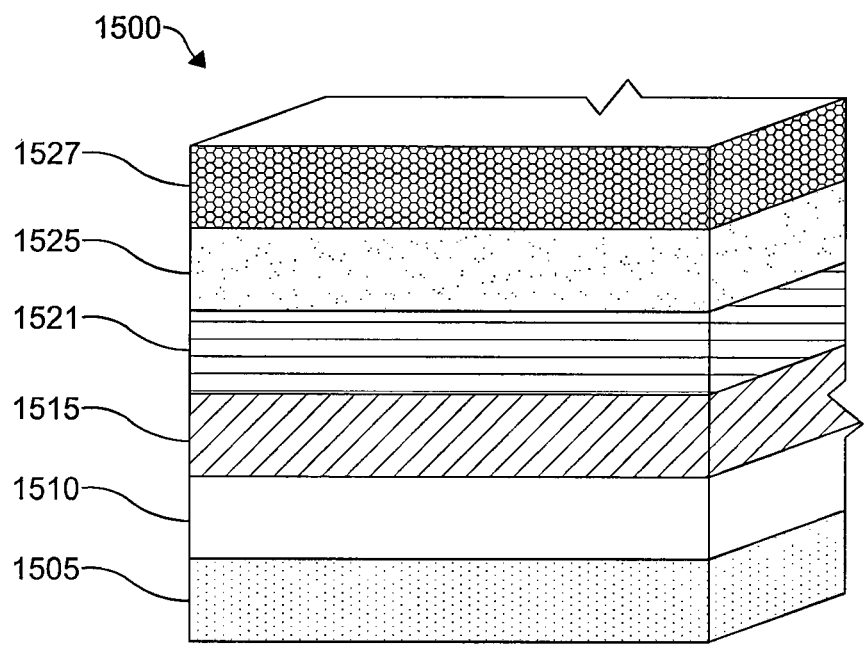
FIG. 9 depicts a schematic of functional layers according to an embodiment of a photovoltaic device.

FIG. 9 shows a photovoltaic device 1500 according to another embodiment of the invention. The photovoltaic device 1500 is similar to the photovoltaic device 1400 of FIG. 8 except that the device 1500 includes a window layer 1515 between a TCO layer 1510 and an absorber layer 1521. Like the photovoltaic device 1400, the photovoltaic device 1500 includes a substrate layer 1505 with the TCO layer 1510 formed thereon, the absorber layer 1521, and a back contact 1525 disposed between a back metal electrode 1527 and the absorber layer 1521. The window layer 1515 is formed from CdS.

Figure 10:
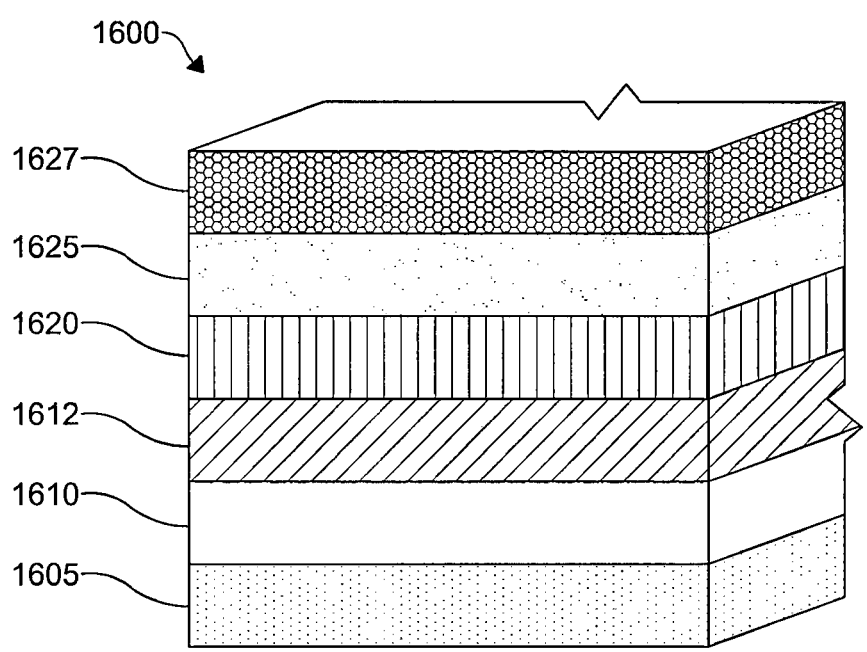
FIG. 10 depicts a schematic of functional layers in a thirteenth embodiment of a photovoltaic device.

FIG. 10 shows a photovoltaic device 1600 similar to the embodiment of FIG. 8 except as described hereinbelow. The substrate layer 1605 has a TCO layer 1610 formed from $SnO_2$:F. An undoped, higher resistivity buffer layer 1612 formed from $SnO_2$ is formed over the TCO layer 1610. The buffer layer has a thickness of about 20 nm-60 nm with a carrier concentration of $1\times10^{17}$ to $1\times10^{19}$ $cm^{-3}$. The photovoltaic device 1600 does not include a window layer. The absorber layer 1620 is formed from a graded composition of $CdSe_xTe_{1-x}$. A bandgap of the absorber layer 1620 is reduced by the presence of Se therein. The variable "x" ranges between 0.05<x<0.30 proximate to the TCO layer 1610; and x<0.01 at a distance from about 800 nm to about 2000 nm away from the TCO layer 1610. The crystal structure is a zinc blend having a residual hexagonal wurtzite structure <5% volume (less than about 5 grains per 100). A total thickness of the absorber layer 1620 ranges from about 1500 nm to about 4500 nm. The absorber layer 1620 can be formed by depositing CdSe/CdTe, $CdSe/CdSe_xTe_{1-x}$/CdTe, CdTe/CdSe/CdTe, $CdS_ySe_{1-y}$/CdTe or $CdSe_xTe_{1-x}$/CdTe film stacks followed by an annealing process similar to that described above with respect to FIG. 8. A back contact 1625 formed from ZnTe or a CdZnTe—ZnTe combination is formed thereon, with a back metal electrode 1627 formed over the back contact 1625.

In the embodiment of FIG. 10, a $CdCl_2$ annealing treatment is provided. The structure is annealed in the presence of $CdCl_2$ flux at a temperature sufficiently high and for a duration sufficiently long to achieve a mid-film grain size of >2 um and with a continuous Se concentration grading. Typical conditions for annealing would be at a temperature from about 420° C. to about 460° C. for between about 5 minutes to about 60 minutes. Chemical additions of $CdCl_2$ to lower eutectic temperature of the $CdCl_2$—CdTe system can be used. For example, from about 20 mg/liter to about 200 mg/liter NaCl in from about 50 gm/liter to about 300 gm/liter aqueous $CdCl_2$ solutions can be added.

Figure 11:
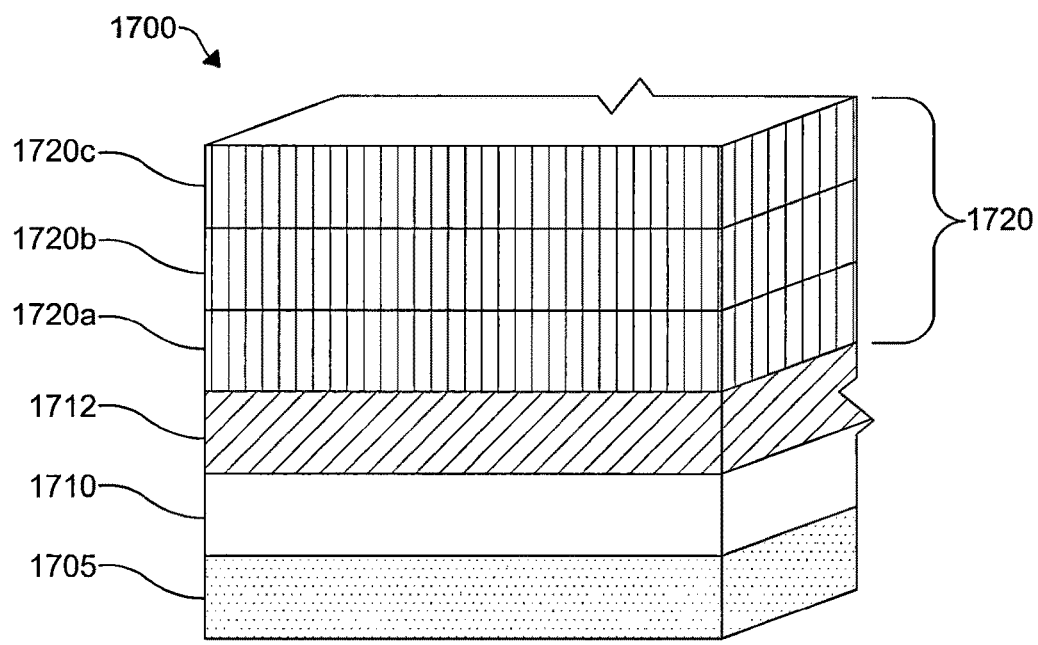
FIG. 11 depicts a schematic of functional layers according to an embodiment of a photovoltaic device.

Another photovoltaic device 1700 according to another embodiment of invention is shown in FIG. 11. The embodiment of FIG. 11 is similar to the embodiment of FIG. 10 except as described herein. The photovoltaic device 1700 includes a substrate layer 1705 having a TCO layer 1710 formed thereon. A buffer layer 1712 is formed on the TCO layer 1710. To eliminate intermixing of the materials forming an absorber layer 1720 that would result in a continuous Se profile with a peak Se concentration located at an interface between the device buffer layer 1712 and the absorber layer 1720, a deposition sequence is changed such that the absorber is formed with multiple layers of material including Se (e.g., Se, CdSe, and the like). A layer with the highest Se concentration is deposited after a layer a lower Se concentration. In the embodiment of FIG. 11, a layer 1720a of CdTe or low Se mole fraction $CdSe_xTe_{1-x}$ is deposited first followed by a deposition of a CdSe or large Se mole fraction $CdSe_xTe_{1-x}$ layer 1720b. A further layer 1720c of CdTe and/or a low Se mole fraction $CdSe_xTe_{1-x}$ is deposited last. The further layer 1720c may be the same as the layer 1720a or different therefrom so long as the layer 1720c has a lower Se concentration than the layer 1720b. A subsequent $CdCl_2$ treatment intermixes the layers 1720a, 1720b, 1720c thereby creating a continuous Se profile in the absorber layer 1720. During the $CdCl_2$ treatment Se diffuses to the interface between the buffer layer 1712 and the absorber layer 1720, which is favorable to interface passivation. The Se concentration at the interface, however, is still lower than in a device where a CdSe or high Se mole fraction $CdSe_xTe_{1-x}$, such as that of the layer 1720b, is deposited first. This deposition sequencing improves an alignment of the buffer and absorber conduction bands while not impacting current collection. Collection losses due to excessive buffer/absorber conduction band offset CBO are avoided, while the Se concentration profile is optimized for maximum light absorption and device performance.

According to additional embodiments of the invention, the absorber layer of the photovoltaic devices disclosed herein, for example photovoltaic device 1400, 1500, 1600, and/or 1700 may include an absorber layer 1421, 1520, 1620, and/or 1720 that may have one of the following compositions to address concerns regarding Se diffusion into a CdTe layer thereof during an annealing process to obtain a desired Se profile:

a) A first structure provides three layers including a layer of CdSe having a thickness from 0.15 μm to about 0.25 μm/from about 0.25 μm to about 0.5 μm CdSeTe/from about 2.75 μm to about 3.25 μm CdTe. The CdSeTe layer may be $CdSe_xTe_{1-x}$ where x is from about 10 at % to about 30 at % Se.

b) Another structure provides four layers including from about 0.15 μm to about 0.35 μm thickness CdSe/from about 0.75 μm to about 1.5 μm thickness CdTe/from about 0.1 μm to about 0.25 μm) thickness CdSe/about 1.5 μm to about 3 μm CdTe.

c) Another structure provides four layers including from about 0.15 μm to about 0.35 μm thickness CdSe/from about 0.75 μm to about 1.5 μm thickness CdTe/from about 0.1 μm to about 0.5 μm thickness CdSeTe/from about 10% to about 30% Se)/about 1.5 μm to about 3 μm thickness CdTe.

d) Another structure provides five layers including from about 0.1 μm to about 0.5 μm thickness CdSeTe and having from about 10 at % to about 30 at % Se/from about 0.15 μm to about 0.35 μm thickness CdSe/from about 0.75 μm to about 1.5 μm thickness CdTe/from about 0.1 μm to about 0.25 μm thickness CdSe/about 1.5 μm to about 3 μm thickness CdTe.

e) Another structure provides five layers including from about 0.1 μm to about 0.5 μm thickness CdSeTe and having from about 10 at % to about 30 at % Se/from about 0.15 μm to about 0.35 μm thickness CdSe/from about 0.75 μm to about 1.5 μm thickness CdTe/from about 0.1 μm to about 0.5 μm thickness CdSeTe and having from about 10 at % to about 30 at % Se/about 1.5 μm to about 3 μm thickness CdTe.

In each of the structures a)-e), the presence of CdSe layers, particularly the presence of CdSe as a third or fourth layer, slows down the Se fluxing from the first CdSe layer due to the small Se concentration gradient. The CdSe layer is allowed to mix with the CdTe layer to form a uniformly thick CdSeTe alloy layer.

For each of the structures a)-e), a device activation process may be performed (e.g., semiconductor grain growth, chlorine diffusion, sulfur and/or selenium interdiffusion into the layers, and the like). In some embodiments of the invention, the activation step involves a process wherein the CdTe surface is treated with a $CdCl_2$ concentrated solution for a period from about 25 minute to about 40 minutes. The device activation process may be followed by a first recharging process for a first duration, which can be performed in either one or two steps. The recharging process may then followed by a second recharge step having a second duration less than the first duration to replenish any lost Cl.

From the foregoing description, one ordinarily skilled in the art can easily ascertain the essential characteristics of this invention and, without departing from the spirit and scope thereof, can make various changes and modifications to the invention to adapt it to various usages and conditions.

What is claimed is:

1. A photovoltaic device comprising:
a transparent conductive oxide (TCO) layer;
a back contact; and
an absorber layer between the TCO layer and the back contact, wherein:
the absorber layer comprises cadmium, selenium, and tellurium in a $CdSe_xTe_{1-x}$ compound, wherein x is less than or equal to 0.30 throughout the absorber layer;
the absorber layer has a concentration gradient of Se therein;
a concentration of Se proximate to the TCO layer is higher than a concentration of Se proximate to the back contact;
a total thickness of the absorber layer is in a range from about 1500 nm to about 4500 nm;
a value of x proximate to the TCO layer is in a range of about 0.05 to 0.30; and
the value of x is less than 0.01 at a distance from about 800 nm to about 2000 nm away from the TCO layer.

2. The photovoltaic device of claim 1, comprising: a buffer layer between the TCO layer and the absorber layer.

3. The photovoltaic device of claim 2, wherein a peak concentration of Se is located at an interface between the buffer layer and the absorber layer.

4. The photovoltaic device of claim 3, wherein the buffer layer comprises magnesium.

5. The photovoltaic device of claim 3, wherein the buffer layer comprises tin oxide.

6. The photovoltaic device of claim 3, wherein the buffer layer has a thickness in a range of 20 nm-60 nm.

7. The photovoltaic device of claim 1, wherein the absorber layer comprises a dopant.

8. The photovoltaic device of claim 1, wherein the back contact comprises one of: ZnTe, CdZnTe, ZnTe:Cu, or a bi-layer including a layer of ZnTe and a layer of CdZnTe.

9. The photovoltaic device of claim 1, further comprising a back metal electrode formed on the back contact, wherein the back metal electrode comprises $MoN_x$.

10. The photovoltaic device of claim 1, wherein the back contact comprises ZnTe.

11. A photovoltaic device comprising:
a transparent conductive oxide (TCO) layer;
a back contact layer; and
an absorber layer between the TCO layer and the back contact layer, wherein:
the absorber comprises a surface proximate to the TCO layer and a surface proximate to the back contact;
the absorber layer is p-type;
the absorber layer comprises a $CdSe_xTe_{1-x}$ compound, wherein x is less than or equal to 0.30 throughout the absorber layer;
the absorber layer has a concentration gradient of Se therein, wherein Se is present throughout the absorber layer; and
a peak concentration of Se, of the concentration gradient of Se, is located within the absorber layer and between the surface proximate to the TCO layer and the surface proximate to the back contact; wherein:
a total thickness of the absorber layer is in a range from about 1500 nm to about 4500 nm;
a value of x proximate to the TCO layer is in a range of about 0.05 to 0.30; and
the value of x is less than 0.01 at a distance from about 800 nm to about 2000 nm away from the TCO layer.

12. The photovoltaic device of claim 11, comprising: a buffer layer between the TCO layer and the absorber layer.

13. The photovoltaic device of claim 12, wherein the buffer layer comprises tin oxide, and the buffer layer has a thickness in a range of 20 nm-60 nm.

14. The photovoltaic device of claim 11, wherein the absorber layer comprises a dopant.

15. The photovoltaic device of claim 11, further comprising a back metal electrode formed on the back contact, wherein the back metal electrode comprises $MoN_x$, and wherein the back contact comprises ZnTe.

16. A method of forming a photovoltaic device comprising the steps of:
depositing a transparent conductive oxide (TCO) layer over a substrate;
depositing an absorber layer over the TCO layer, wherein the absorber layer comprises cadmium, selenium, and tellurium in a $CdSe_xTe_{1-x}$ compound, wherein x is less than or equal to 0.30 throughout the absorber layer; and wherein:
a concentration of Se proximate to the TCO layer is higher than a concentration of Se proximate to the back contact;
a total thickness of the absorber layer is in a range from about 1500 nm to about 4500 nm;
a value of x proximate to the TCO layer is in a range of about 0.05 to 0.30; and
the value of x is less than 0.01 at a distance from about 800 nm to about 2000 nm away from the TCO layer; and
depositing a back contact over the absorber layer, whereby the absorber layer is between the TCO layer and the back contact.

17. The method of claim 16, further comprising: depositing a buffer layer on the TCO layer prior to the step of depositing the absorber layer, whereby the buffer layer is between the TCO layer and the absorber layer.

18. The method of claim 16, wherein the absorber layer comprises a dopant.

19. The method of claim 16, wherein the back contact comprises ZnTe.

20. The method of claim 16, wherein the buffer layer comprises tin oxide.

* * * * *